(12) United States Patent
Matsuda et al.

(10) Patent No.: US 10,536,090 B2
(45) Date of Patent: Jan. 14, 2020

(54) BUS BAR STRUCTURE AND POWER CONVERSION DEVICE USING SAME

(71) Applicant: Mitsubishi Electric Corporation, Chiyoda-ku (JP)

(72) Inventors: Tetsuya Matsuda, Chiyoda-ku (JP); Shigeto Fujita, Chiyoda-ku (JP); Tetsuo Motomiya, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/317,236

(22) PCT Filed: Aug. 1, 2017

(86) PCT No.: PCT/JP2017/027819
§ 371 (c)(1),
(2) Date: Jan. 11, 2019

(87) PCT Pub. No.: WO2018/043002
PCT Pub. Date: Mar. 8, 2018

(65) Prior Publication Data
US 2019/0319544 A1 Oct. 17, 2019

(30) Foreign Application Priority Data

Sep. 2, 2016 (JP) ................................ 2016-171492

(51) Int. Cl.
| | |
|---|---|
| *H02M 7/00* | (2006.01) |
| *H02M 1/34* | (2007.01) |
| *H02M 7/537* | (2006.01) |
| *H05K 7/02* | (2006.01) |
| *H05K 7/04* | (2006.01) |

(52) U.S. Cl.
CPC ............ *H02M 7/003* (2013.01); *H02M 1/34* (2013.01); *H02M 7/537* (2013.01); *H05K 7/023* (2013.01); *H05K 7/04* (2013.01); *H02M 2001/346* (2013.01)

(58) Field of Classification Search
CPC ........ H02M 7/003; H02M 7/537; H02M 1/34; H02M 2001/346; H02M 7/48; H05K 7/04; H05K 7/023
USPC ....................................... 174/129 B; 361/624
See application file for complete search history.

(56) References Cited

U.S. PATENT DOCUMENTS

| | | | |
|---|---|---|---|
| 2009/0015992 A1* | 1/2009 | Nohara | .................. H02M 5/271 361/624 |
| 2013/0264891 A1* | 10/2013 | Sawada | ................... H02M 3/00 307/147 |

FOREIGN PATENT DOCUMENTS

JP 2005-237118 A 9/2005

OTHER PUBLICATIONS

International Search Report dated Oct. 24, 2017 in PCT/JP2017/027819 filed Aug. 1, 2017.

* cited by examiner

*Primary Examiner* — Sherman Ng
(74) *Attorney, Agent, or Firm* — Oblon, McClelland, Maier & Neustadt, L.L.P.

(57) ABSTRACT

There has been a problem that a chip or a power module is broken by a repulsive electromagnetic force between positive and negative bus bars and an arc is generated, so that the failure is escalated. Therefore, positive and negative bus bars connecting two devices are configured so as to form a one-turn-loop current path, thereby suppressing a repulsive (Continued)

electromagnetic force occurring between the bus bars and decreasing a possibility of occurrence of an arc at the power module.

14 Claims, 30 Drawing Sheets

BUS BAR STRUCTURE AND POWER CONVERSION DEVICE USING SAME

TECHNICAL FIELD

The present invention relates to a bus bar structure and a power conversion device using the structure.

BACKGROUND ART

Conventional bus bars of a power conversion device are configured such that a narrowed area is formed near a terminal of each of the positive-side bus bar and the negative-side bus bar, and the narrowed areas are formed in such a positional relationship as to coincide with each other in the opposition direction of the positive-side and negative-side bus bars opposed to each other in the up-down direction (see, for example, Patent Document 1). Owing to such a structure, positive and negative currents coincide with each other in the up-down direction at the narrowed areas and the inductance is reduced, whereby surge voltage can be reduced.

However, since the inductance is reduced, on the other hand, short-circuit current increases, thus causing a problem that an electromagnetic force of the bus bars increases.

CITATION LIST

Patent Document

Patent Document 1: Japanese Laid-Open Patent Publication No. 2005-237118

SUMMARY OF THE INVENTION

Problems to be Solved by the Invention

In the power conversion device, a capacitor and a power module (composed of electrodes and multiple chips) are connected to each other via the positive and negative bus bars through which currents flow in directions opposite to each other on the upper side and the lower side. In the case where the above-described conventional bus bar configuration is applied to such a power conversion device, when a chip in the power module is short-circuited, excessive short-circuit current flows from the capacitor to the bus bars, whereby a great repulsive electromagnetic force occurs between the bus bars. The repulsive electromagnetic force occurring between the bus bars is a repulsive force of the positive and negative bus bars that is caused by excessive currents flowing in the opposite directions through the positive and negative bus bars. As a result, a chip or the power module is broken by the repulsive electromagnetic force between the bus bars, whereby an arc occurs, leading to a problem that the failure is escalated. The present invention has been made to solve the above problem, and an object of the present invention is to, even when a short-circuit failure occurs at, for example, a chip in a power module, suppress a repulsive electromagnetic force occurring between bus bars, thereby decreasing a possibility of occurrence of an arc at the power module.

Solution to the Problems

A bus bar structure according to the present invention is a bus bar structure connected between a first device and a second device and comprising a first bus bar and a second bus bar arranged so as to be opposed to each other in a direction of a y axis perpendicular to a direction of an x axis, the direction of the x axis being a connection direction between the first device and the second device. With a direction of a z axis defined as a direction perpendicular to the direction of the x axis and the direction of the y axis, the first bus bar includes: a first connection portion connected to the first device via a first end and extending in a positive direction of the z axis from the first end; a first bent portion bent in a positive direction of the x axis with respect to the first connection portion; and a second connection portion bent in a negative direction of the z axis with respect to the first bent portion and connected to the second device. The second bus bar includes: a third connection portion connected to the first device via a second end and extending in the negative direction of the z axis from the second end; a second bent portion bent in the positive direction of the x axis with respect to the third connection portion; and a fourth connection portion bent in the positive direction of the z axis with respect to the second bent portion and connected to the second device. The first bent portion and the second bent portion are arranged at positions shifted from each other in the direction of the z axis. The connection to the first device and the second device is made such that a direction of current flowing from the first device via the first bus bar to the second device and a direction of current flowing from the first device via the second bus bar to the second device are opposite to each other.

Effect of the Invention

In the bus bar structure according to the present invention, the inductance of the bus bars is increased, whereby short-circuit current is suppressed, and as a result, an electromagnetic force applied to the bus bars can be reduced.

DESCRIPTION OF EMBODIMENTS

Embodiment 1

Figure 1:
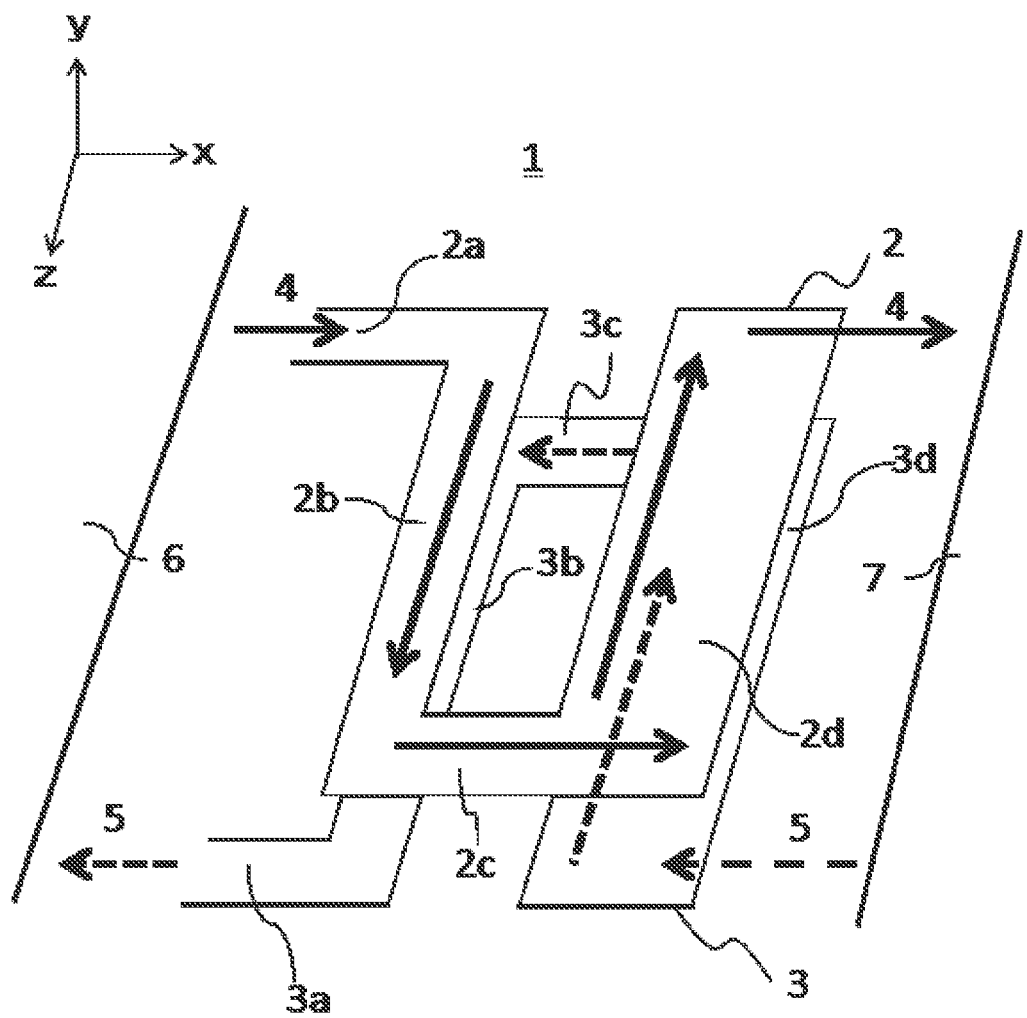
FIG. 1 is a perspective view showing a bus bar structure according to embodiment 1 of the present invention.

FIG. 1 is a perspective view showing the structure of a bus bar according to embodiment 1 of the present invention. In FIG. 1, a bus bar structure 1 is provided between a first device 6 and a second device 7 arranged side by side in an x-axis direction. In the bus bar structure 1, an upper bus bar 2 and a lower bus bar 3 are arranged so as to be opposed to each other in a y-axis direction perpendicular to the x-axis direction. A direction perpendicular to both of the x-axis direction and the y-axis direction is defined as a z-axis direction. In the drawings, an arrow direction of each of the x axis, the y axis, and the z axis is defined as a positive direction, and the direction opposite thereto is defined as a negative direction. Here, the upper bus bar 2 and the lower bus bar 3 are both made of a conductor such as metal.

The upper bus bar 2 is composed of: a first end 2a which is connected to the first device 6 and through which current 4 is introduced; a first connection portion 2b bent in the positive direction of the z axis from the first end 2a; a first bent portion 2c bent in the positive direction of the x axis from the first connection portion 2b; and a second connection portion 2d which is bent in the negative direction of the z axis from the first bent portion 2c and connected to the second device 7, and through which current 4 is led out. The lower bus bar 3 is composed of: a second end 3a which is connected to the first device 6 and through which current 5 is led out; a third connection portion 3b bent in the negative direction of the z axis from the second end 3a; a second bent portion 3c bent in the positive direction of the x axis from the third connection portion 3b; and a fourth connection portion 3d which is bent in the positive direction of the z axis from the second bent portion 3c and connected to the second device 7, and through which current 5 is introduced. The first bent portion and the second bent portion are located at positions shifted from each other in the z-axis direction.

Before the detailed description of embodiment 1 of the present invention, a conventional bus bar structure and a problem thereof will be described.

Figure 2:
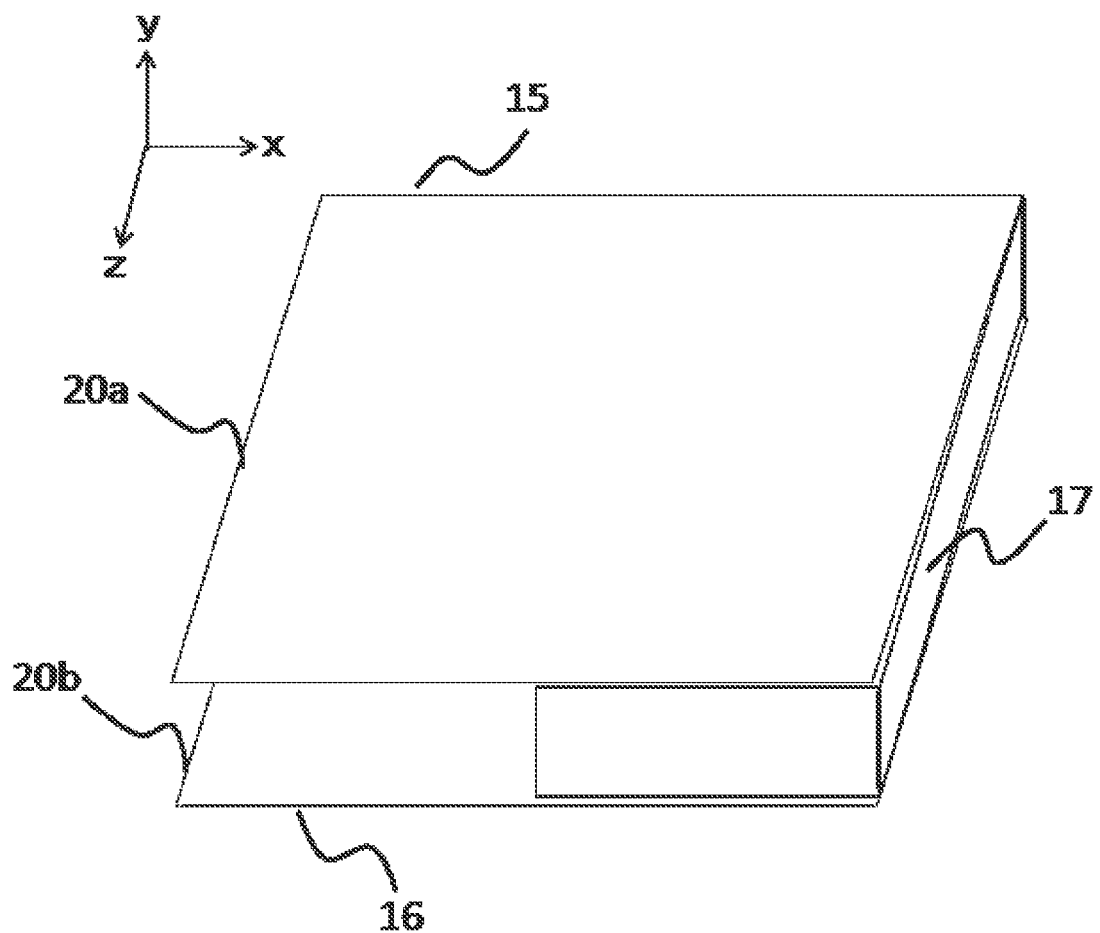
FIG. 2 is a perspective view showing the structure of a conventional bus bar for power conversion device.

FIG. 2 shows the conventional bus bar structure. In FIG. 2, an upper bus bar 15 and a lower bus bar 16 are arranged so as to be opposed to each other in the y-axis direction, and are formed by conductors (flat bus bars) that are flat in the x-axis direction. A power module 17 is sandwiched between the upper bus bar 15 and the lower bus bar 16, and an external device (not shown) such as a motor or a power supply is connected to a current introduction port 20a and a current lead-out port 20b. The power module 17 and the external device may be considered to be included in the second device 7 in each embodiment of the present invention.

Figure 3:
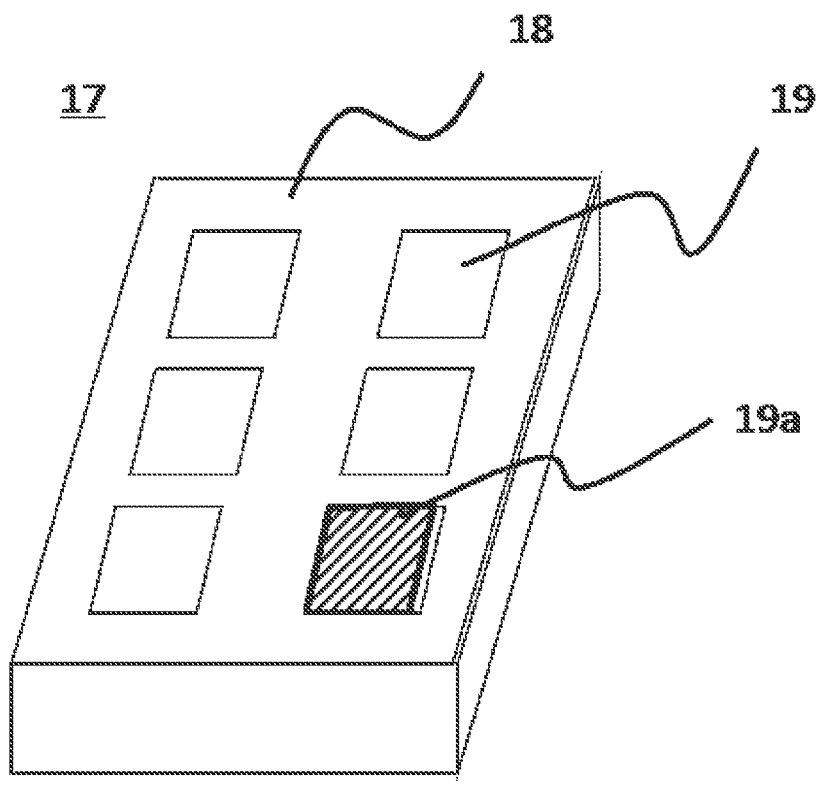
FIG. 3 is a perspective view showing the configuration of a power module.

FIG. 3 shows the power module 17 taken out. In FIG. 3, a chip 19 is formed by a switching element such as an IGBT (Insulated Gate Bipolar Transistor) or a MOSFET (Metal Oxide Semiconductor Field-Effect Transistor), and a plurality of the chips 19 are stored in a case 18. In the example shown in FIG. 3, six chips 19 are provided. In addition, 19a at the lower right of the case indicates a short-circuited chip. ON/OFF of current is controlled by the chips being switched on/off on the basis of control signals inputted to control terminals (not shown).

Figure 4A:
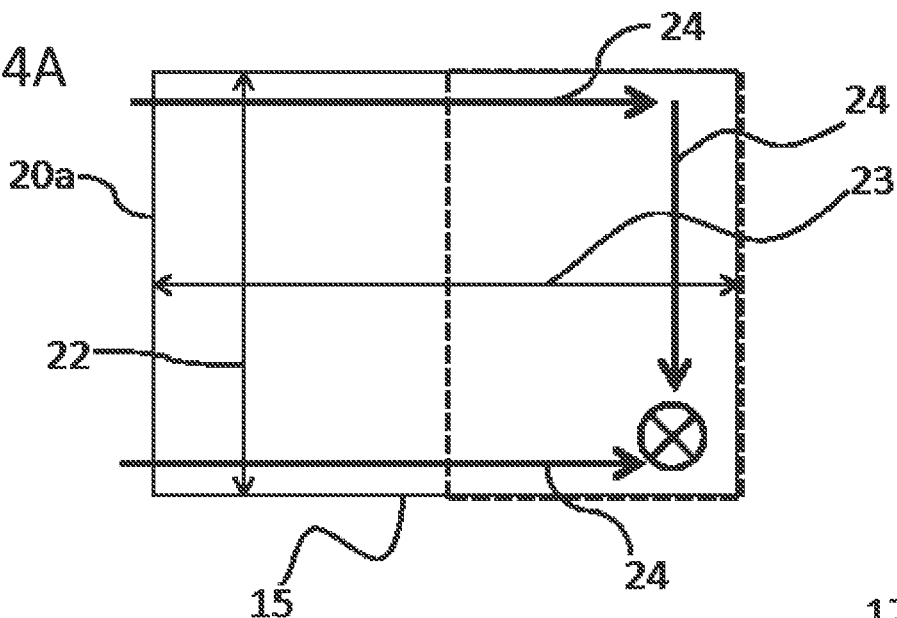
FIG. 4A is a plan view showing a current route in a conventional upper bus bar.
Figure 4B:
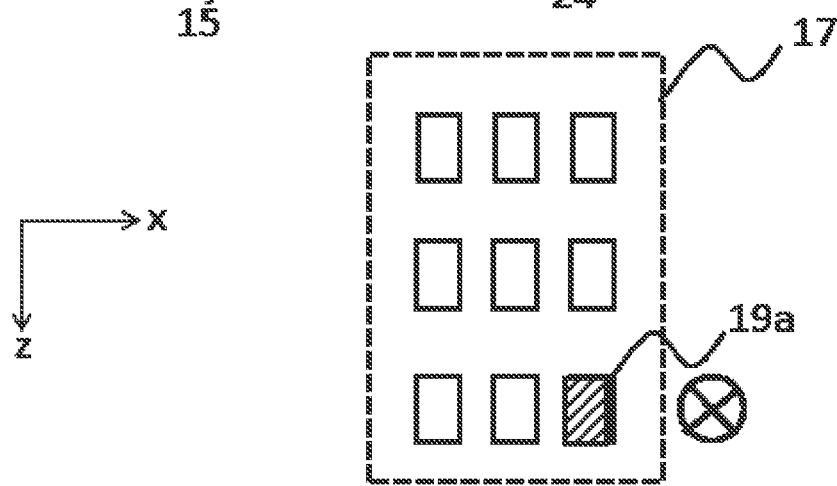
FIG. 4B is a plan view showing a current route in the power module that is short-circuited.
Figure 4C:
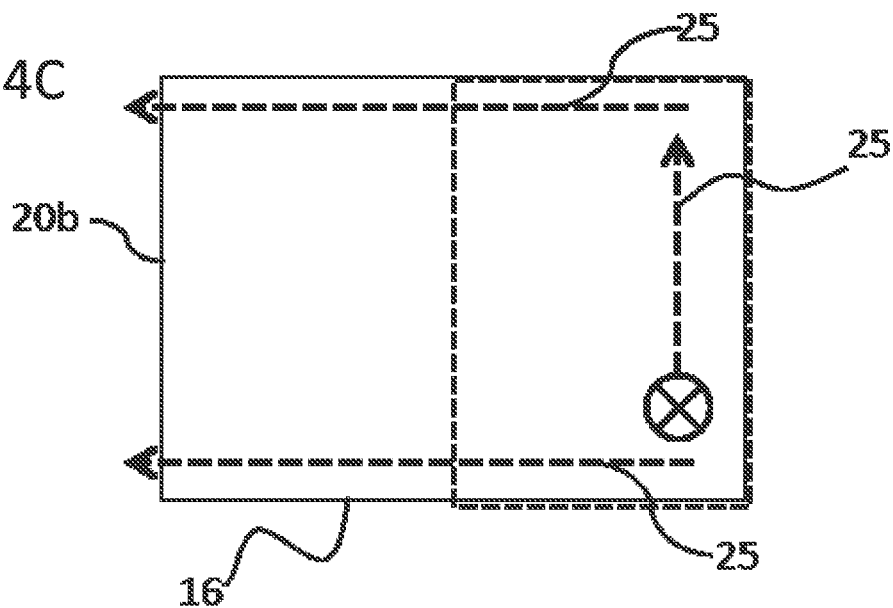
FIG. 4C is a plan view showing a current route in a conventional lower bus bar.

FIG. 4A, FIG. 4B, and FIG. 4C show short-circuit current routes in the case where the short-circuited chip 19a exists in the conventional bus bar structure shown in FIG. 2. FIG. 4A, FIG. 4B, and FIG. 4C are bus bar plan views, i.e., views as seen in the y-axis direction.

FIG. 4A shows a short-circuit current route in the upper bus bar 15, FIG. 4B shows a short-circuit current route in the short-circuited power module 17, and FIG. 4C shows a short-circuit current route in the lower bus bar 16. Short-circuit current 24 flowing through the upper bus bar 15 is indicated by a solid line, and short-circuit current 25 flowing through the lower bus bar 16 is indicated by a dotted line.

The short-circuit current 24 flows in from the current introduction port 20a. The short-circuit current 24 has a high frequency, and in the case where a bus bar width 22 is sufficiently greater than the skin thickness, the short-circuit current 24 flows so as to branch along the peripheries of the upper bus bar 15 and the lower bus bar 16. It is noted that, when AC current flows through a conductor, the current density is high at the surface of the conductor and decreases at a part away from the surface. Such a phenomenon is called skin effect. Here, in the case where current at the conductor surface is defined as 1, the skin thickness is a thickness from the conductor surface to a part where current attenuates to 1/e in the depth direction of the conductor.

As shown in the drawing, in the upper bus bar 15, the short-circuit current 24 flows so as to branch to both ends of the upper bus bar 15 having the width 22, and then the currents merge on the short-circuited chip 19a so as to flow via the short-circuited chip 19a to the lower bus bar 16 (short-circuit current 25). Further, the short-circuit current 25 flows so as to branch to both width ends of the lower bus bar 16 as in the upper bus bar 15, and then flow through the current lead-out port 20b to the external device.

Figure 5A:
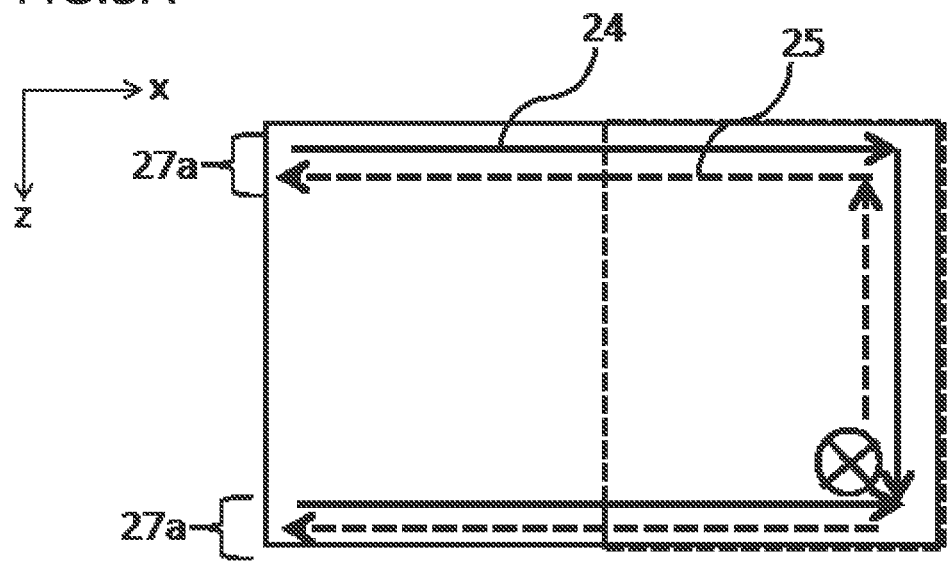
FIG. 5A is a plan view showing a current route in the conventional bus bar for power conversion device.
Figure 5B:
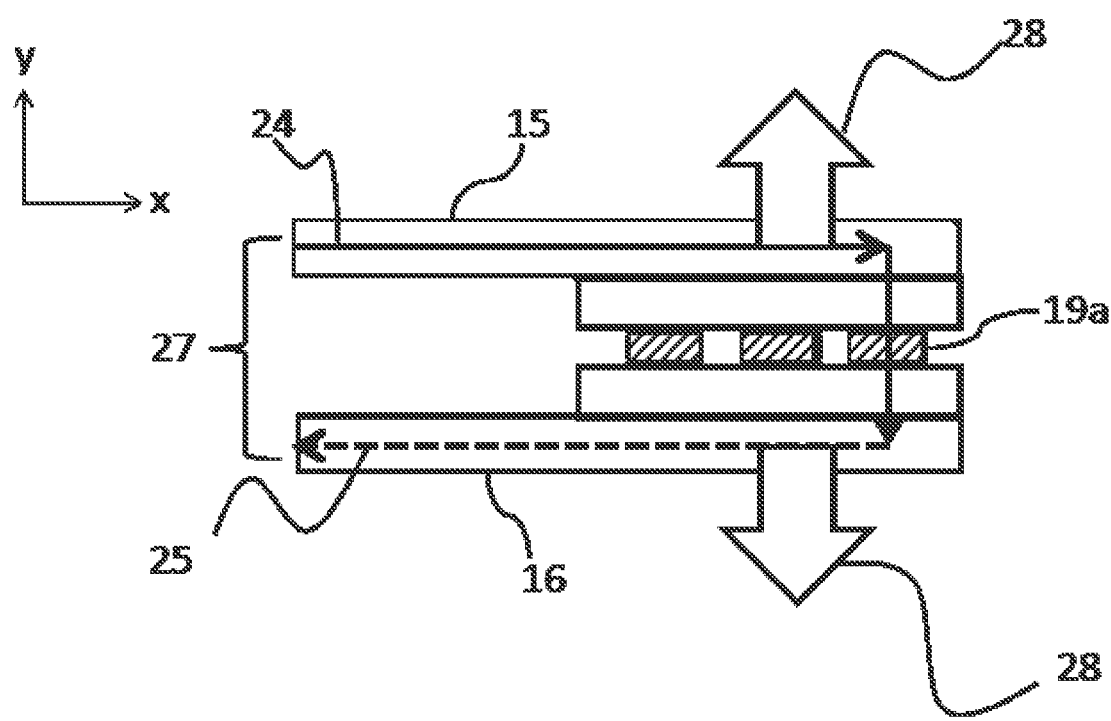
FIG. 5B is a side view showing a current route in the conventional bus bar for power conversion device.

FIG. 5A is a view (plan view) of the upper and lower bus bars 15, 16 overlapped with each other, as seen in the y-axis direction, and FIG. 5B is a view (side view) thereof as seen in the z-axis direction.

As is found from FIG. 5A, at the same coordinate position in the z-axis direction, currents 27 flow in directions opposite to each other in the x-axis direction. That is, the positions of the short-circuit current 24 and the short-circuit current 25 flowing through the upper and lower bus bars 15, 16 almost coincide with each other. In this case, as shown in FIG. 5B, great repulsive electromagnetic forces 28 act in directions opposite to each other in the y-axis direction on the upper and lower bus bars 15, 16. In the worst case, by the repulsive electromagnetic forces 28, a gap occurs between each bus bar 15, 16 and the power module 17 or the chip 19, and thus an arc is generated. The generation of the arc leads to escalation of the failure. Therefore, it is necessary to reduce the repulsive electromagnetic forces 28 as much as possible.

A structure obtained by improving the above point is the above-described bus bar structure shown in FIG. 1. Next, the operation principle in FIG. 1 will be described.

Figure 6A:
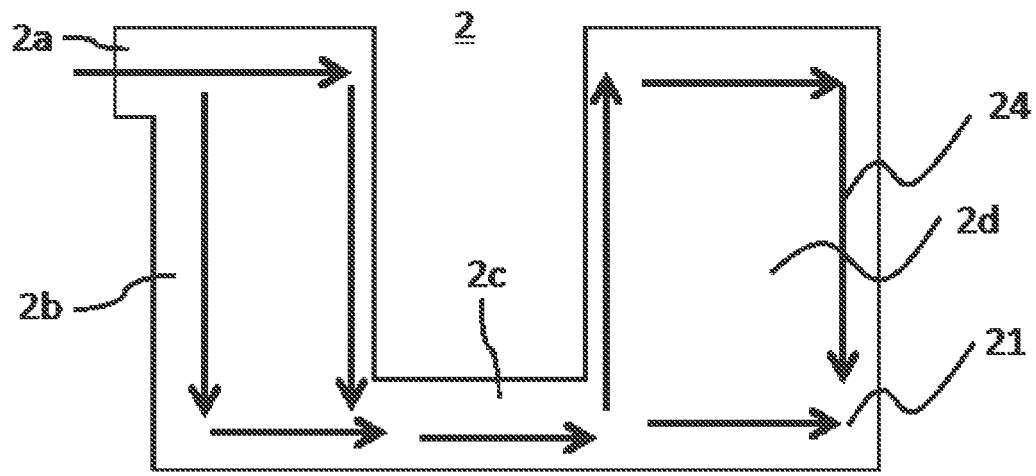
FIG. 6A is a plan view showing a current distribution in an upper bus bar of the bus bar structure according to embodiment 1 of the present invention.
Figure 6B:
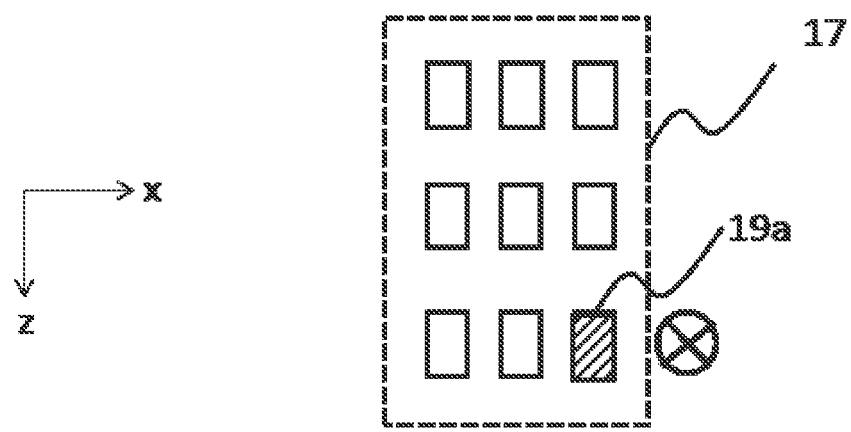
FIG. 6B is a plan view showing a current route in the power module that is short-circuited.
Figure 6C:
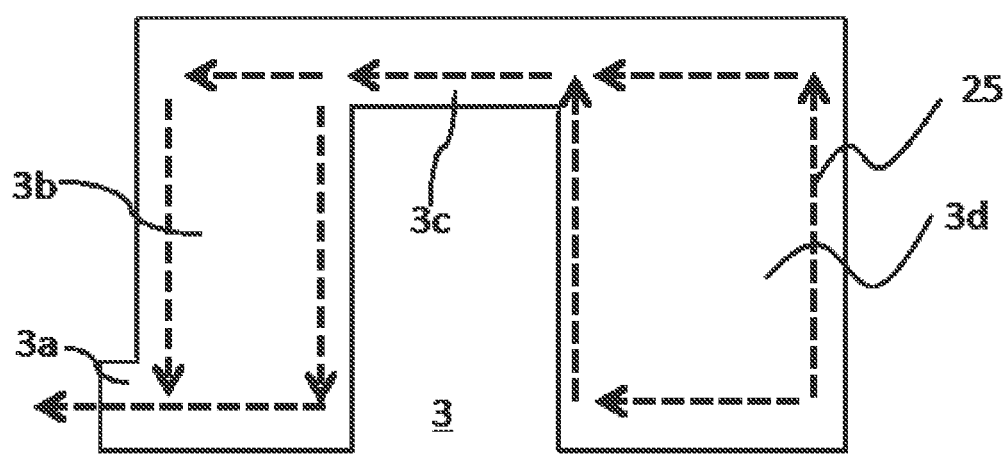
FIG. 6C is a plan view showing a current distribution in a lower bus bar of the bus bar structure according to embodiment 1 of the present invention.

FIG. 6A shows a current route in the upper bus bar 2, FIG. 6B shows a current route in the short-circuited chip 19a in the power module 17, and FIG. 6C shows a current route in the lower bus bar 3. The second device 7 shown in FIG. 1 corresponds to the power module 17 in FIG. 6B.

In FIG. 6A and FIG. 6C, an external device (not shown) such as a motor or a power supply as the first device is connected to the first end 2a and the second end 3a, as described in FIG. 2. The widths in the x-axis direction of the first connection portion 2b and the second connection portion 2d of the upper bus bar 2 are set to be greater than the width in the z-axis direction of the first bent portion 2c. The width in the z-axis direction of the first bent portion 2c is set to be about six times the skin thickness, and in the case where the frequency of the short-circuit current is sufficiently high, the short-circuit current flows almost evenly and uniformly in the surface of the first bent portion 2c. However, the width in the x-axis direction of the second connection portion 2d is set to be greater than six times the skin thickness because the power module 17 shown in FIG. 6B is placed there. Therefore, the short-circuit current flows only in the peripheral area, and no current flows in some area at the center part. In addition, in embodiment 1 of the present invention, the width in the x-axis direction of the first connection portion 2b is also set to be greater than six times the skin thickness, and thus the short-circuit current flows only in the peripheral area.

In FIG. 6C, the area of the third connection portion 3b of the lower bus bar 3 is set to be equal to the area of the first connection portion 2b, and the area of the fourth connection portion 3d is set to be equal to the area of the second connection portion 2d. The width in the z-axis direction of the second bent portion 3c is set to be about six times the skin thickness, as in the first bent portion 2c. The power module 17 is sandwiched between the second connection portion 2d and the fourth connection portion 3d, and these are electrically connected. In the above example, the width in the x-axis direction of the first connection portion 2b is set to be about six times the skin thickness. However, this width may be equal to or smaller than six times the skin thickness. Reducing the width in the x-axis direction increases heat generation but can obtain a compact configuration.

Next, the direction of current will be described. Regarding the upper bus bar 2, the short-circuit current 24 flows in from the first end 2a, flows in the positive direction of the z axis through the periphery of the first connection portion 2b, and then turns in the positive direction of the x axis at the first bent portion 2c. Further, in the second connection portion 2d, the short-circuit current 24 flows along the periphery of the second connection portion 2d toward the short-circuited chip 19a at the lower right of the power module 17. In FIG. 6B, the short-circuit current 24 flows in the negative direction of the y axis so as to penetrate the short-circuited chip 19a, and then flows into the fourth connection portion 3d of the lower bus bar 3 shown in FIG. 6C.

In the lower bus bar 3 shown in FIG. 6C, the short-circuit current 25 flows in the negative direction of the x axis from the fourth connection portion 3d through the second bent portion 3c, and then flows from the third connection portion 3b to the second end 3a. As in the upper bus bar 2, the short-circuit current 25 flows in the peripheries of the fourth connection portion 3d and the third connection portion 3b except for the second bent portion 3c.

Figure 7A:
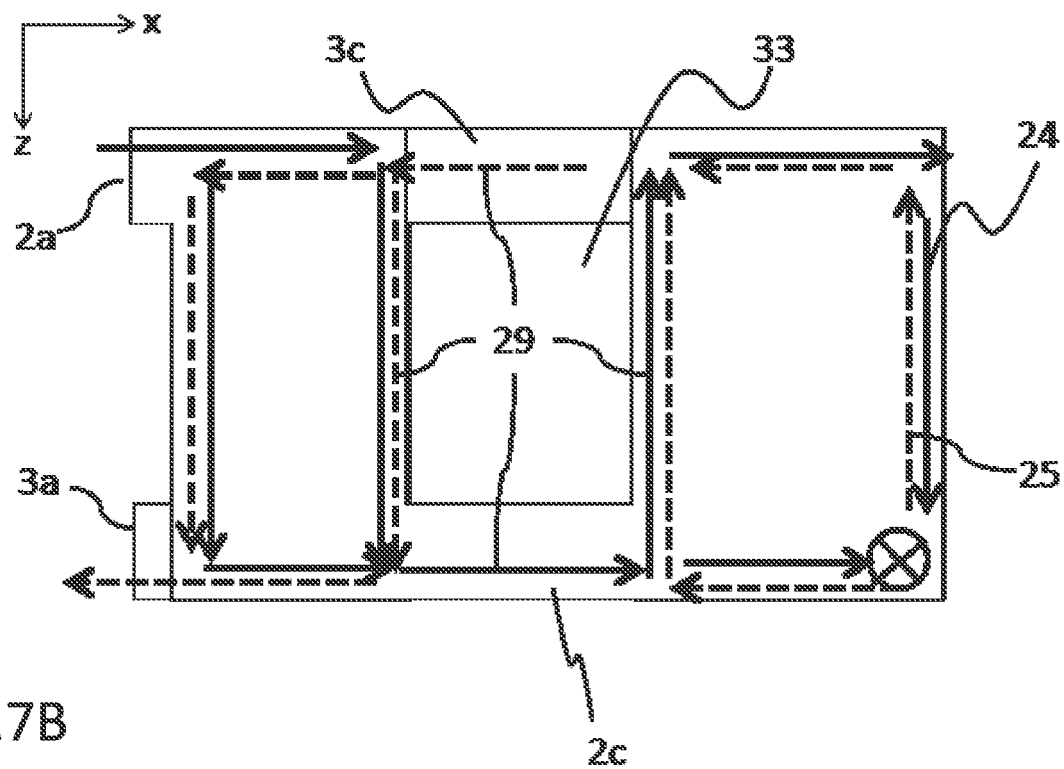
FIG. 7A is a plan view showing a current route in the bus bar structure according to embodiment 1 of the present invention.
Figure 7B:
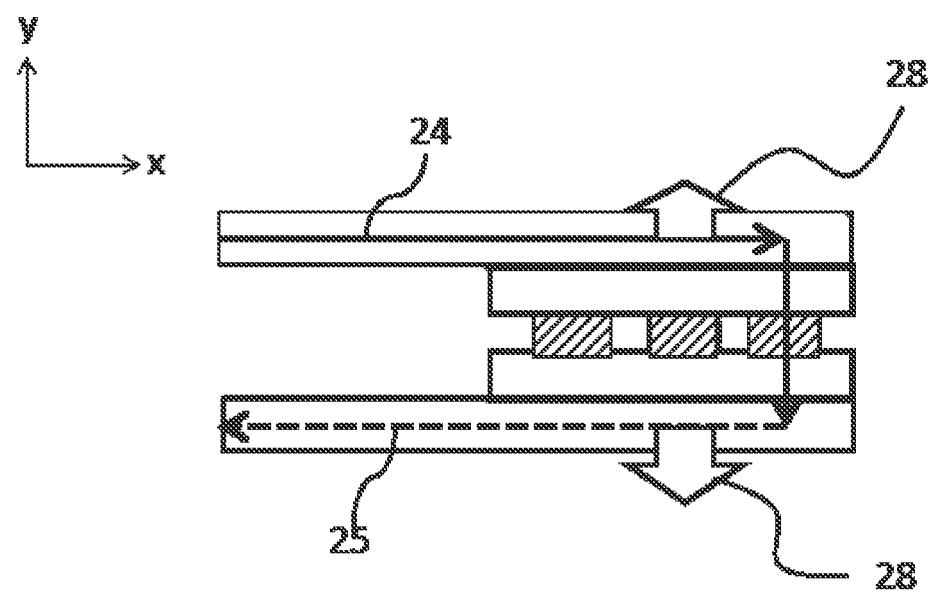
FIG. 7B is a side view showing a current route in the bus bar structure according to embodiment 1 of the present invention.

FIG. 7A is a view (plan view) showing a state in which the upper bus bar 2 through which the short-circuit current 24 flows and the lower bus bar 3 through which the short-circuit current 25 flows are overlapped with each other, as seen in the y-axis direction, and FIG. 7B is a view (side view) thereof as seen in the z-axis direction.

FIG. 7A is a plan view as seen in the y-axis direction. The first bent portion 2c and the second bent portion 3c are arranged so as to be opposed to each other in the z-axis direction. Therefore, the short-circuit current flowing through the first bent portion 2c and the short-circuit current flowing through the second bent portion 3c are directed in directions opposite to each other and are distant from each other in the z-axis direction.

Further, the short-circuit current in the first connection portion 2b and the short-circuit current in the third connection portion 3b flow in the same direction toward the positive direction of the z axis. In addition, the short-circuit currents flowing in the negative direction of the z axis through the second connection portion 2d and the fourth connection portion 3d also flow in the same direction.

That is, in FIG. 7A, as seen in the y-axis direction, an opening 33 is formed by the first connection portion 2b, the first bent portion 2c, and the second connection portion 2d of the upper bus bar 2 and the fourth connection portion 3d, the second bent portion 3c, and the third connection portion 3b of the lower bus bar 3. The short-circuit current flows so as to make one round surrounding the periphery of the opening 33, thus forming a one-turn loop 29 of a current path.

As a result of formation of the one-turn loop 29, the inductance of the current route increases, i.e., the impedance increases. Thus, current flowing through the bus bar structure 1 is suppressed, and the repulsive electromagnetic forces 28 shown in FIG. 7B are also suppressed.

In the first connection portion 2b and the third connection portion 3b, currents flow in the same direction toward the positive direction of the z axis, and in the second connection portion 2d and the fourth connection portion 3d, currents flow in the same direction toward the negative direction of the z axis, whereby an attractive electromagnetic force occurs. Thus, the repulsive electromagnetic force in the bus bar structure 1 can be further suppressed, and a possibility that separation occurs by an electromagnetic force and an arc is generated, can be decreased.

Figure 8:
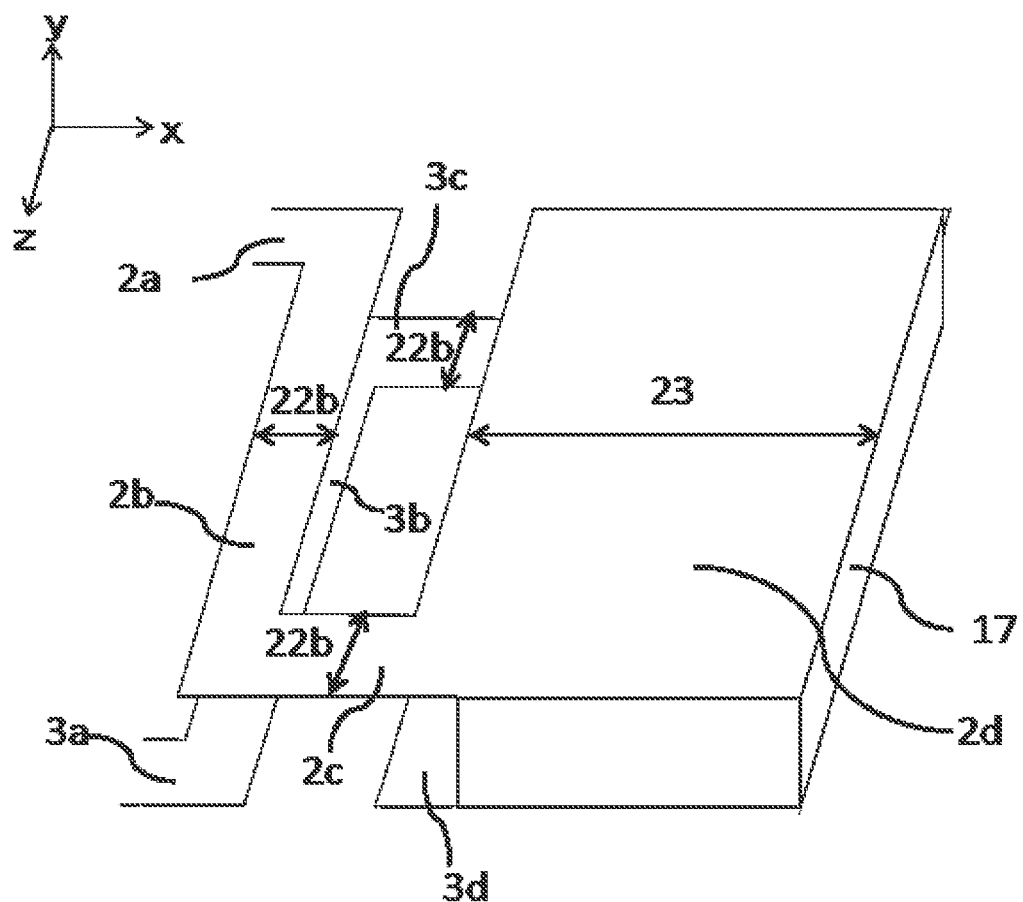
FIG. 8 is a perspective view showing the structure of another bus bar structure according to embodiment 1 of the present invention.

FIG. 8 is a perspective view showing another bus bar structure according to embodiment 1 of the present invention. As shown in FIG. 8, in embodiment 1 of the present invention, widths 22b in the x-axis direction of the first connection portion 2b and the third connection portion 3b are set to be shorter than the widths in the x-axis direction of the second connection portion 2d and the fourth connection portion 3d. If the lengths in the x-axis direction of the first bent portion 2c and the second bent portion 3c are made greater, the inductance becomes greater.

The inductance can be increased by the above setting. However, the widths 22b are set to be about six times the skin thickness, and if the widths 22b are smaller than this value, the current density increases and thus heat generation occurs, so that the temperature becomes more likely to increase.

Figure 9:
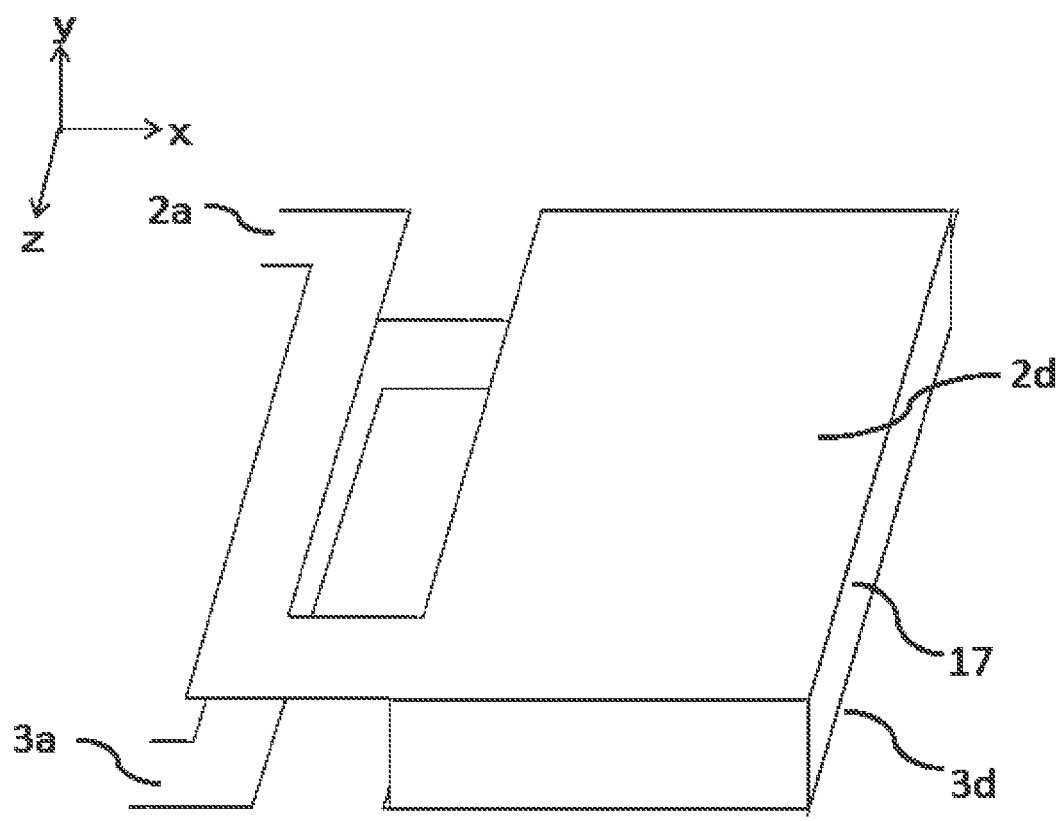
FIG. 9 is a perspective view showing the structure of still another bus bar structure according to embodiment 1 of the present invention.

As shown in FIG. 9, even in the case where the width of the power module 17 is almost equal to the width of the second connection portion 2d and the width of the fourth connection portion 3d, the same effects are obtained.

Embodiment 2

In embodiment 1 of the present invention, as shown in FIG. 6 to FIG. 9, the first end 2a and the second end 3a are formed to be opposed to each other in the z-axis direction, between the upper bus bar 2 and the lower bus bar 3. In embodiment 2 of the present invention, as shown in FIG. 10A, current is introduced or led out directly from the ends of the first connection portion 2b and the third connection portion 3b.

Figure 10A:
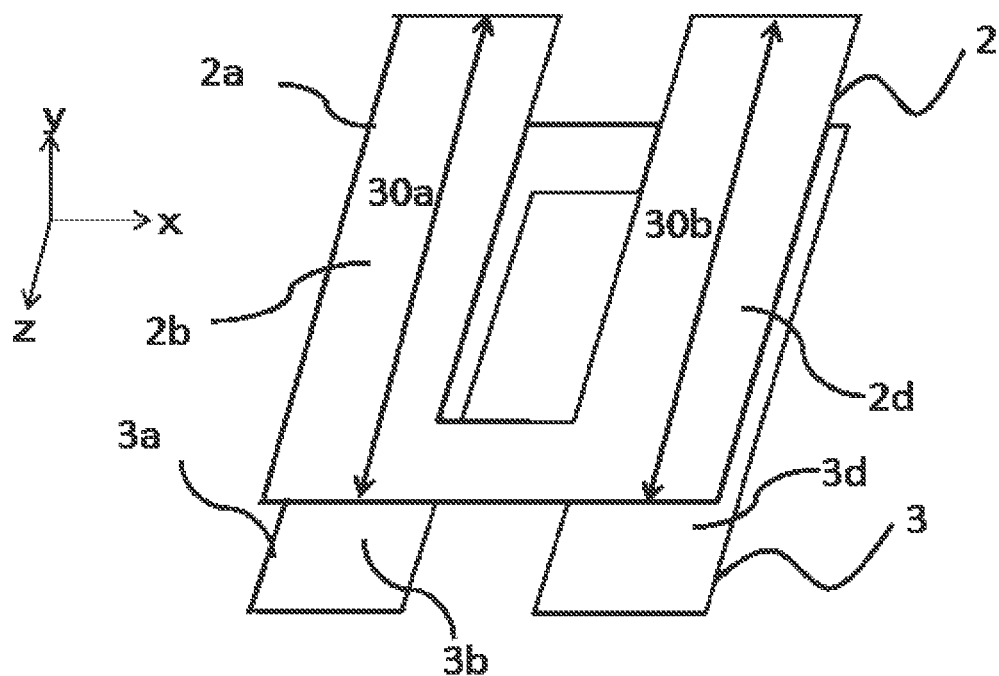
FIG. 10A is a perspective view showing the structure of a bus bar structure according to embodiment 2 of the present invention.
Figure 10B:
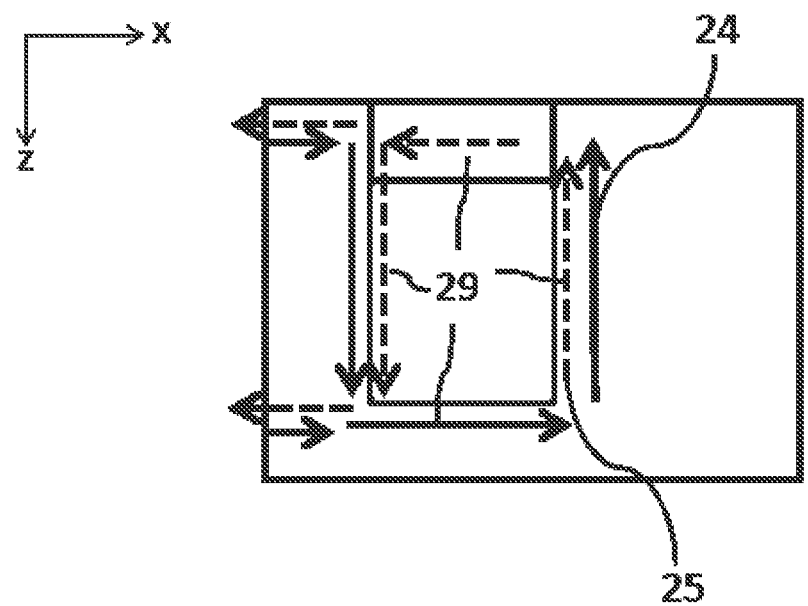
FIG. 10B is a plan view showing a current route in the bus bar structure shown in FIG. 10A.

That is, in FIG. 10A, lead-out portions that are current introduction portions are the entire z-axis-direction end surfaces of the first connection portion 2b and the second connection portion 3b. In the shown example, a width 30a and a width 30b in the z-axis direction are set to be equal to each other. However, these widths may not necessarily be equal to each other, that is, the width 30a in the z-axis direction may be greater than the width 30b, or the width 30a in the z-axis direction may be smaller than the width 30b. FIG. 10B shows a part of short-circuit current flowing through the bus bar structure 1 shown in FIG. 10A. In the case where the width in the x-axis direction of the first connection portion 2b is sufficiently greater than six times the skin thickness, short-circuit current introduced from both ends in the z-axis direction of the first connection portion 2b causes a current component flowing in the positive direction of the z axis at a side, of the first connection portion 2b, that is closer to the second connection portion 2d. Thus, a one-turn loop 29 of a current path is formed, whereby an electromagnetic force reducing effect is obtained as compared to the conventional flat bus bars shown in FIG. 5A and FIG. 5B.

Embodiment 3

Figure 11A:
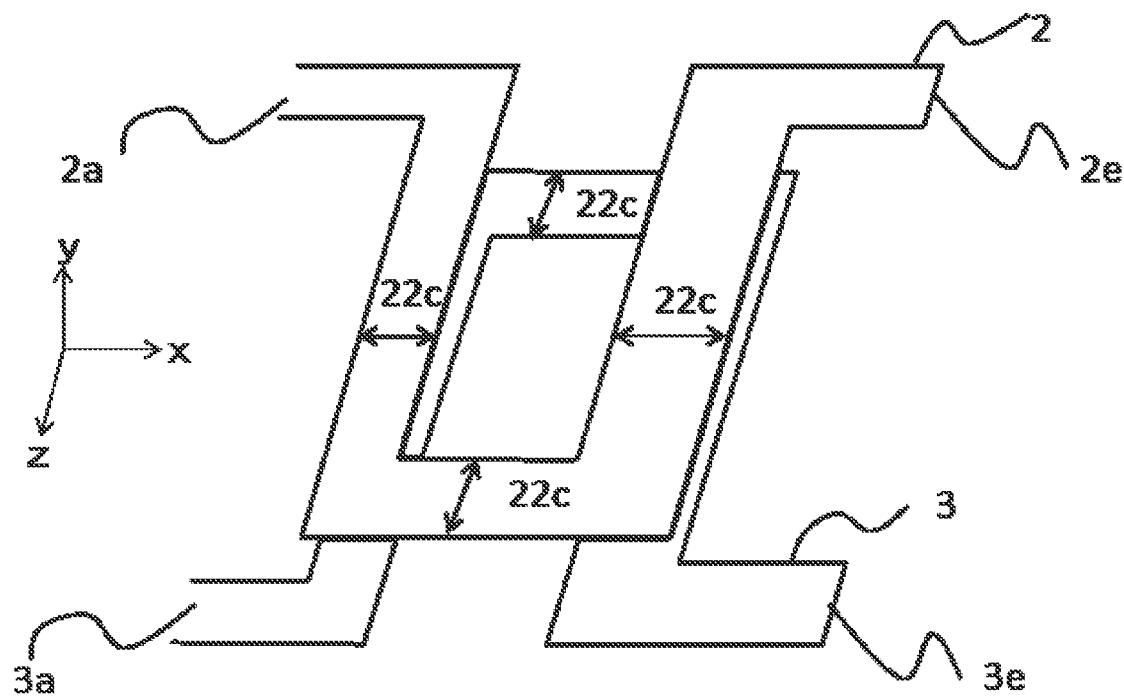
FIG. 11A is a perspective view showing the structure of a bus bar structure according to embodiment 3 of the present invention.

FIG. 11A is a perspective view of a bus bar structure according to embodiment 3 of the present invention. In embodiment 3 of the present invention, as shown in FIG. 11A, a third end 2e of the upper bus bar 2 and a fourth end 3e are arranged so as to be opposed to each other in the z-axis direction. The third end 2e and the fourth end 3e are connected to the power module 17 (not shown). The entire upper bus bar 2 and the entire lower bus bar 3 have a constant width 22c. It is desirable that the constant width 22c is about six times the skin thickness as described above.

Figure 11B:
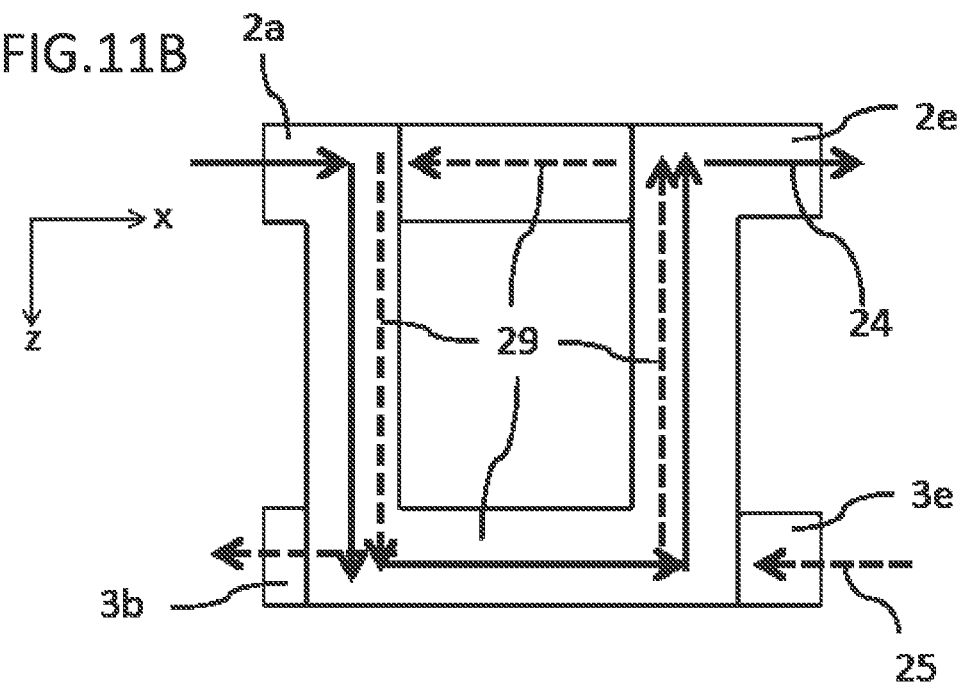
FIG. 11B is a plan view showing a current route in the bus bar structure shown in FIG. 11A.

As in the embodiments described thus far, as shown in FIG. 11B, a one-turn loop 29 of a short-circuit current path is formed by the upper bus bar 2 and the lower bus bar 3. In order to increase the inductance, conventionally, a coil is wound and the coil is connected or sandwiched between the bus bars. However, an inductance increasing effect can be obtained by a simple configuration in which the bus bars are formed by making cuts/cutouts in two flat plates opposed to each other, as shown in the configuration shown in FIG. 11A.

Embodiment 4

Figure 12:
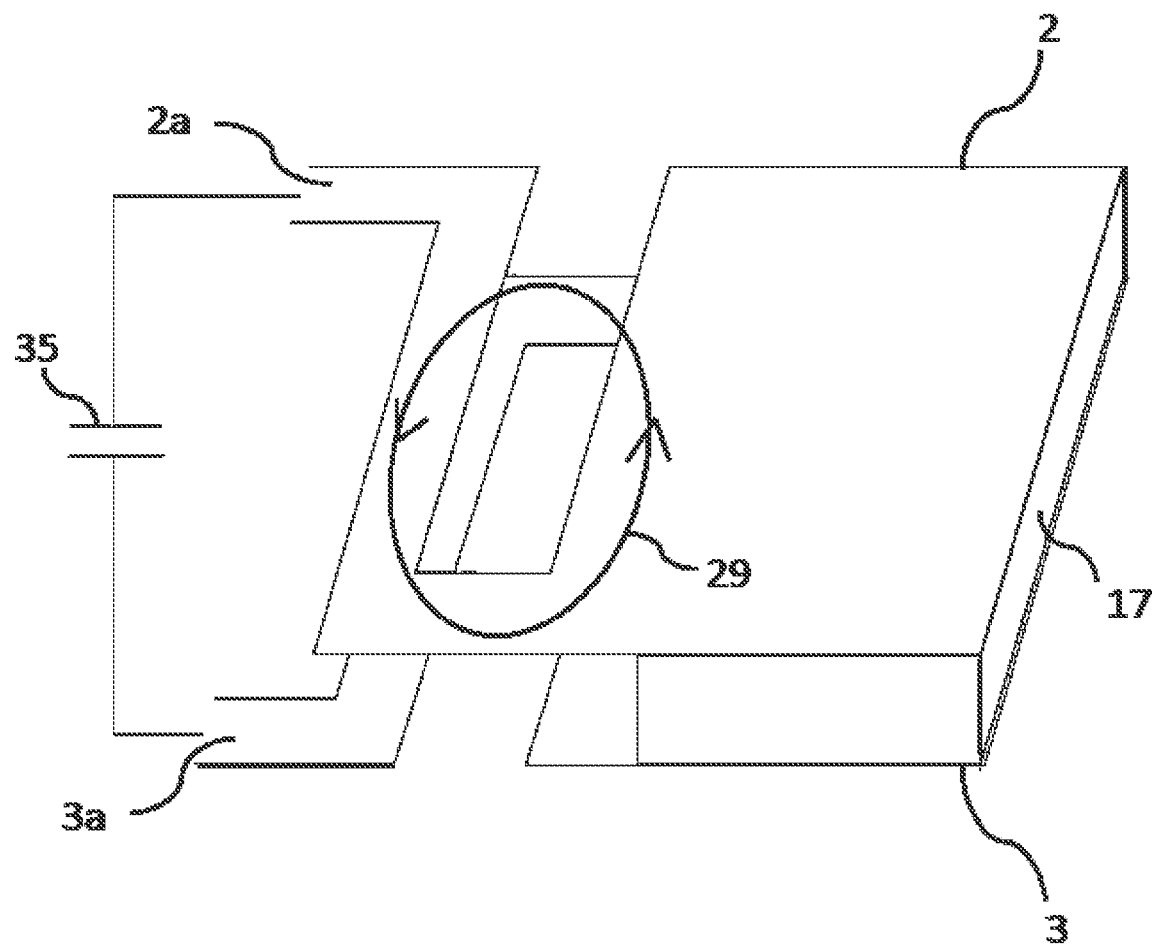
FIG. 12 illustrates the connection state between a bus bar structure and an external device according to embodiment 4 of the present invention.
Figure 13:
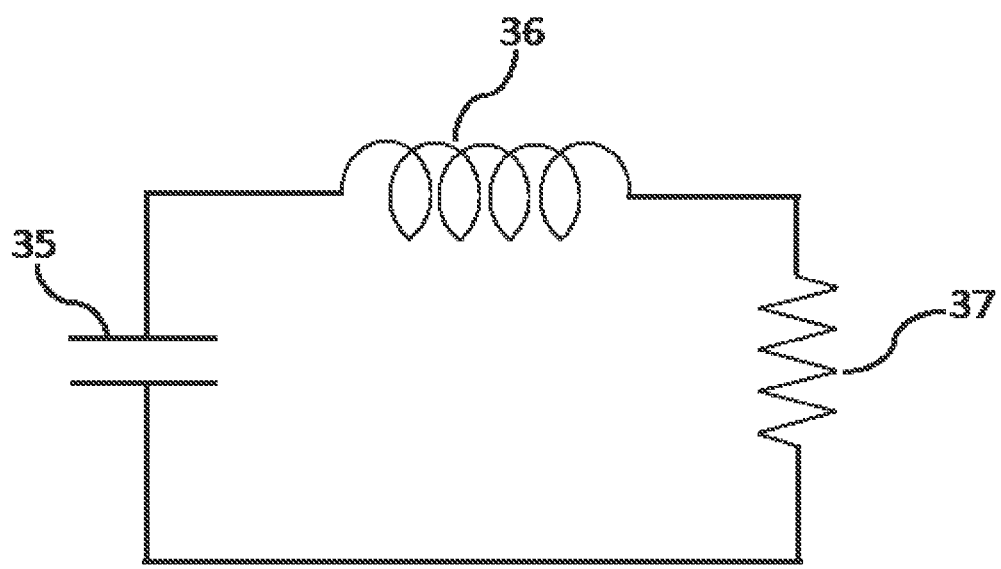
FIG. 13 is a circuit diagram showing an equivalent circuit of the connection state shown in FIG. 12.

In embodiment 1 of the present invention, there is no prescription for a device that is connected to the first end 2a as shown in FIG. 8. In embodiment 4 of the present invention, as shown in FIG. 12, a capacitor 35 is connected between the first end 2a and the second end 3a. FIG. 13 shows an equivalent circuit of the configuration shown in FIG. 12. In the circuit shown in FIG. 13, an inductance 36 of a one-turn loop formed by the bus bars is denoted by L, the capacitance of the capacitor 35 is denoted by C, and the resistance of a circuit including a resistance 37 of the short-circuited chip is denoted by R.

It is noted that, in embodiment 4 of the present invention, the chip is assumed to be short-circuited and therefore can be represented by the resistance R.

When the chip in the power module is short-circuited, current from the capacitor 35 flows into the upper bus bar 2 and the lower bus bar 3 via the short-circuited chip 19a.

In general, as compared to the inductance L (inductance 36 in FIG. 13) of a route passing from the first end 2a through the upper bus bar 2, the power module 17, and then the lower bus bar 3 to the second end 3a, the resistance (resistance 37 in FIG. 13) of the route is small and thus can be neglected. In this case, the circuit in FIG. 13 becomes a simple LC circuit, and the maximum current is proportional to $\sqrt{(C/L)}$. That is, the current decreases almost in proportion to $\sqrt{(1/L)}$. That is, as shown in FIG. 12, the one-turn loop 29 of a current path is formed by the upper bus bar 2 and the lower bus bar 3, whereby the inductance L increases and the peak current of the short-circuit current decreases, and thus the maximum repulsive electromagnetic force can be reduced.

Figure 14:
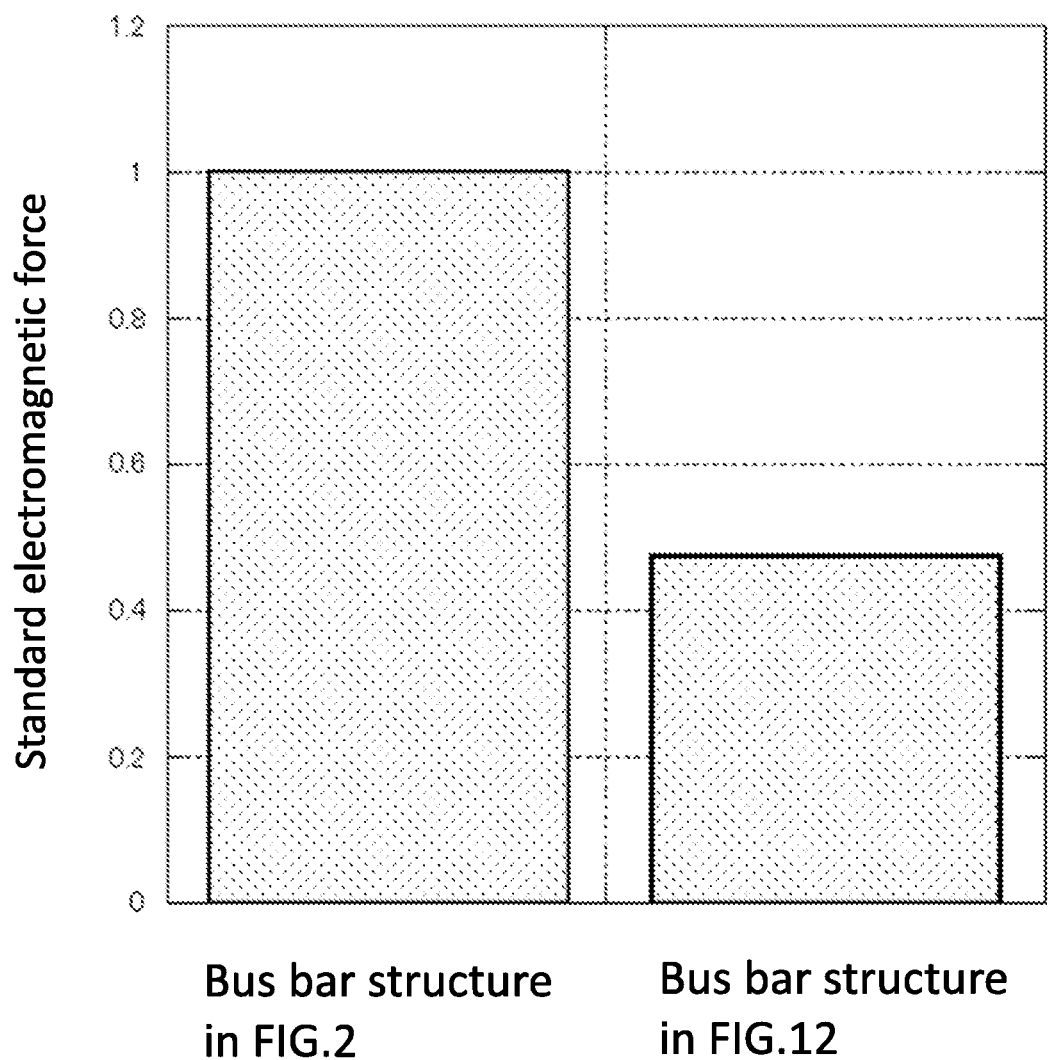
FIG. 14 is a graph showing an analysis result for an electromagnetic force in the bus bar structure according to embodiment 4 of the present invention.

A finite element method model of the bus bar structure shown in FIG. 12 in embodiment 4 of the present invention in a state in which the capacitor 35 is connected is generated. In this model, short-circuit current and a repulsive electromagnetic force are calculated by a finite element method. In addition, for the purpose of comparison, short-circuit current and a repulsive electromagnetic force are calculated by a finite element method also for the case where the capacitor 35 is connected to the ends 20a, 20b in the conventional flat bus bar structure shown in FIG. 2 in embodiment 1 of the present invention, i.e., the case where the capacitor 35 is connected to the flat bus bars. FIG. 14 shows a result of comparison therebetween.

It is found out through a finite element method analysis that, if the electromagnetic force in the conventional flat bus bar shown in FIG. 2 is defined as 1, the electromagnetic force in the bus bar structure in embodiment 4 of the present invention in which the one-turn loop is formed as shown in FIG. 12 can be reduced to about ½ as shown in FIG. 14.

Embodiment 5

Figure 15:
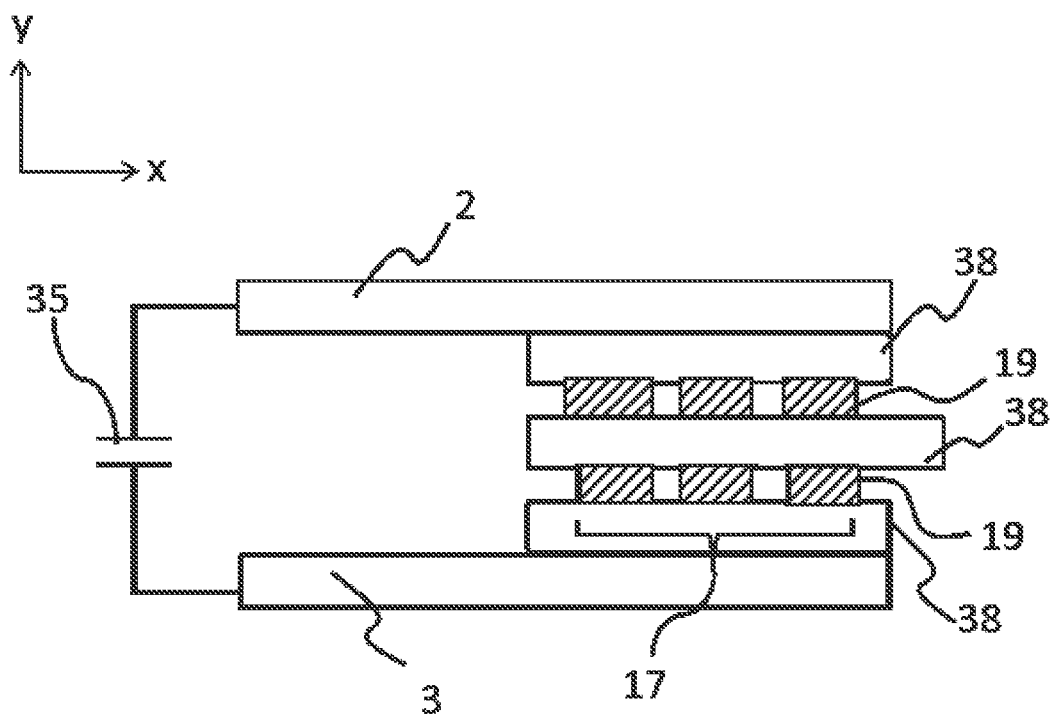
FIG. 15 is a side view showing another structure of a bus bar structure according to embodiment 5 of the present invention.

FIG. 15 is a side view of a bus bar structure according to embodiment 5 of the present invention. In the embodiments described thus far, only one power module 17 is sandwiched between the upper and lower bus bars 2 and 3. The bus bar structure of embodiment 5 of the present invention is formed in a multilayer structure in which power modules 17 are provided in two layers and sandwiched with three electrodes 38 serving also for cooling the chips, between the bus bars, as shown in FIG. 15. Also in such a multilayer structure, a repulsive electromagnetic force reducing effect can be obtained by adopting the bus bar structures shown in FIG. 6, FIG. 8, FIG. 9, FIG. 10, and FIG. 12 as described in embodiments 1 to 5 of the present invention. In particular, in the bus bar structure shown in FIG. 15, the interval between the upper bus bar 2 and the lower bus bar 3 is expanded, whereby the inductance is further increased and the short-circuit current reducing effect is enhanced.

Embodiment 6

Figure 16A:
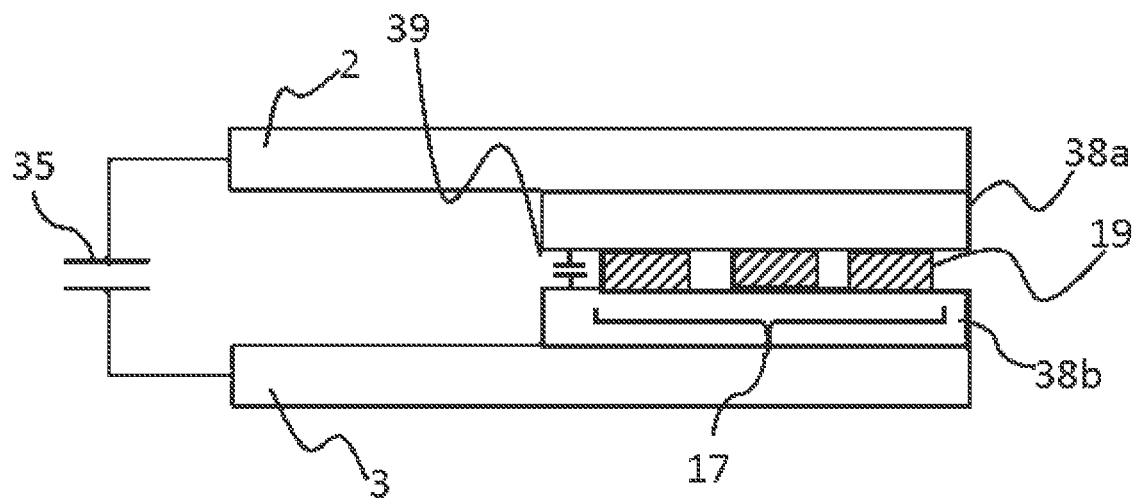
FIG. 16A is a side view showing the structure of a bus bar structure according to embodiment 6 of the present invention.
Figure 16B:
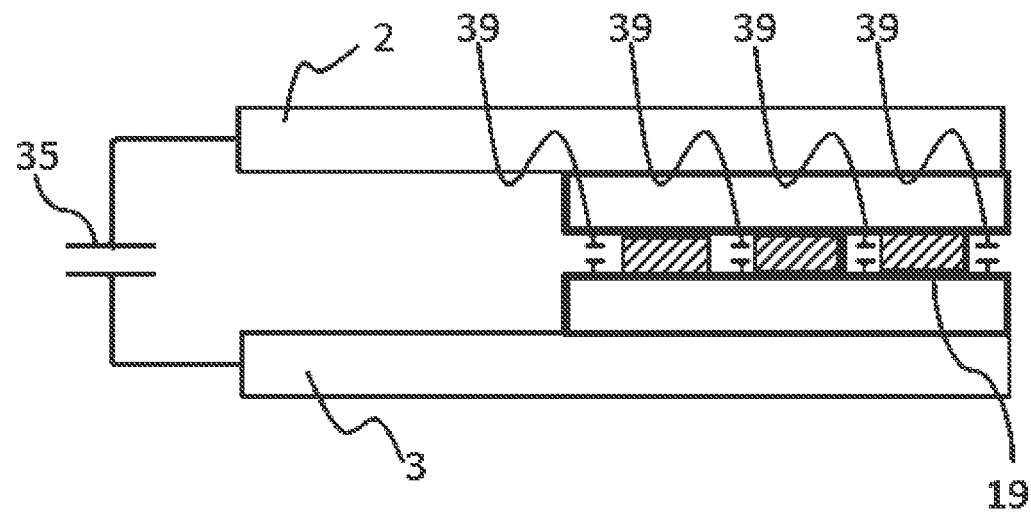
FIG. 16B is a side view showing another structure of the bus bar structure according to embodiment 6 of the present invention.

FIG. 16A and FIG. 16B are side views of a bus bar structure according to embodiment 6 of the present invention. In embodiment 6 of the present invention, a snubber capacitor 39 is provided between an electrode 38a and an electrode 38b near the chips 19. In the bus bar structure shown in embodiment 4 of the present invention, the upper and lower bus bars 2, 3 are formed so as to increase the inductance, whereby current at the time of short circuit is decreased and thus a repulsive electromagnetic force at the time of short circuit is reduced.

In this case, during a normal operation, since the inductance is great, surge voltage increases, so that inconvenience might occur. In order to suppress this, the snubber capacitor 39 may be provided between the electrode 38a and the electrode 38b near the chips 19, or near the power module 17 side of the second connection portion 2d and the fourth connection portion 3d. By this snubber capacitor 39, surge voltage can be absorbed. Although one snubber capacitor 39 may be provided, as shown in FIG. 16B, a plurality of snubber capacitors 39 may be provided near the chips 19, whereby the surge voltage absorbing effect is further increased.

Embodiment 7

Figure 17:
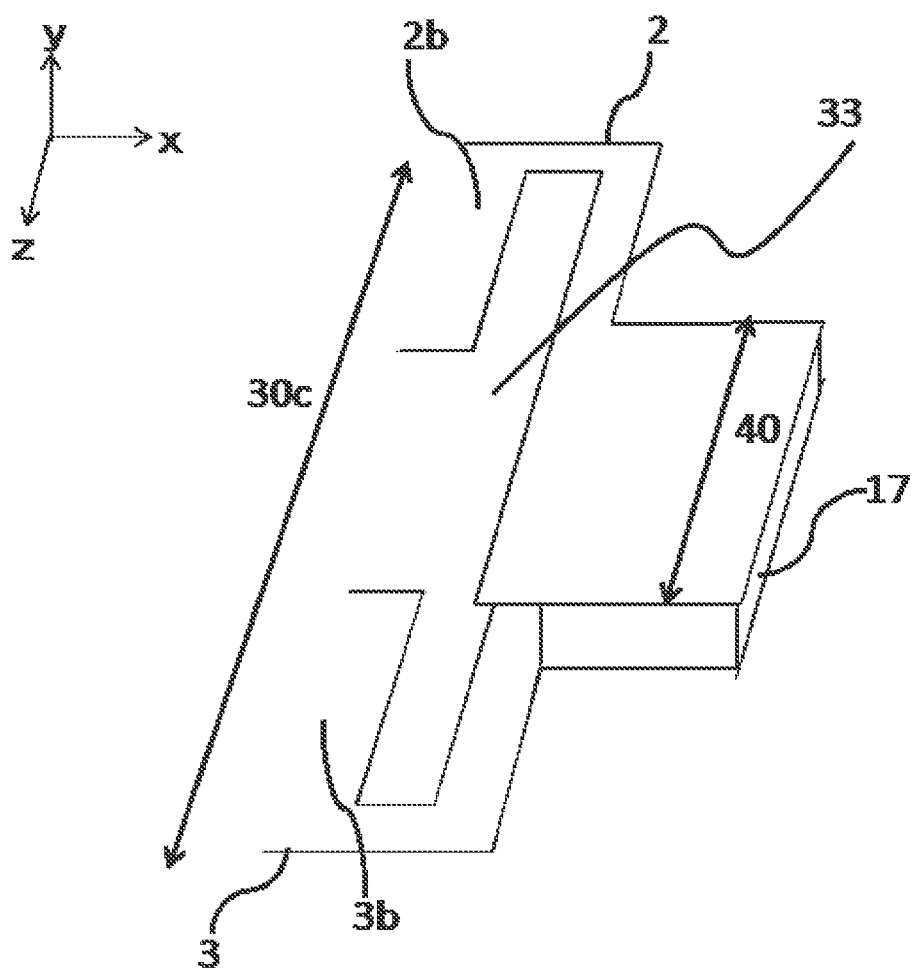
FIG. 17 is a perspective view showing the structure of a bus bar structure according to embodiment 7 of the present invention.

FIG. 17 is a perspective view of a bus bar structure according to embodiment 7 of the present invention. In embodiment 7 of the present invention, the upper and lower bus bars 2, 3 are extended in the z-axis direction.

In the embodiments described thus far, the widths in the z-axis direction of the upper bus bar 2 and the lower bus bar 3 are equal to the width of the connected power module 17. In the case where there is some space margin in the z-axis direction and it is necessary to obtain a further great inductance, the upper and lower bus bars 2, 3 may be extended in the z-axis direction. In embodiment 7 of the present invention, as shown in FIG. 17, the upper and lower bus bars 2, 3 are extended to have a bus bar width 30c in the positive and negative directions of the z axis. In this case, the opening 33 is formed to be large, whereby a one-turn loop of a current path becomes large, the inductance increases, and the current reducing effect also increases.

In embodiment 7 of the present invention, as shown in FIG. 17, the power module 17 is placed at the center portion in the bus bar width 30c. A width 40 of the power module may be shifted in either of the positive direction or the negative direction of the z axis.

Although not shown here, the external device is connected to the ends of the first connection portion 2b and the third connection portion 3b.

Embodiment 8

Figure 18:
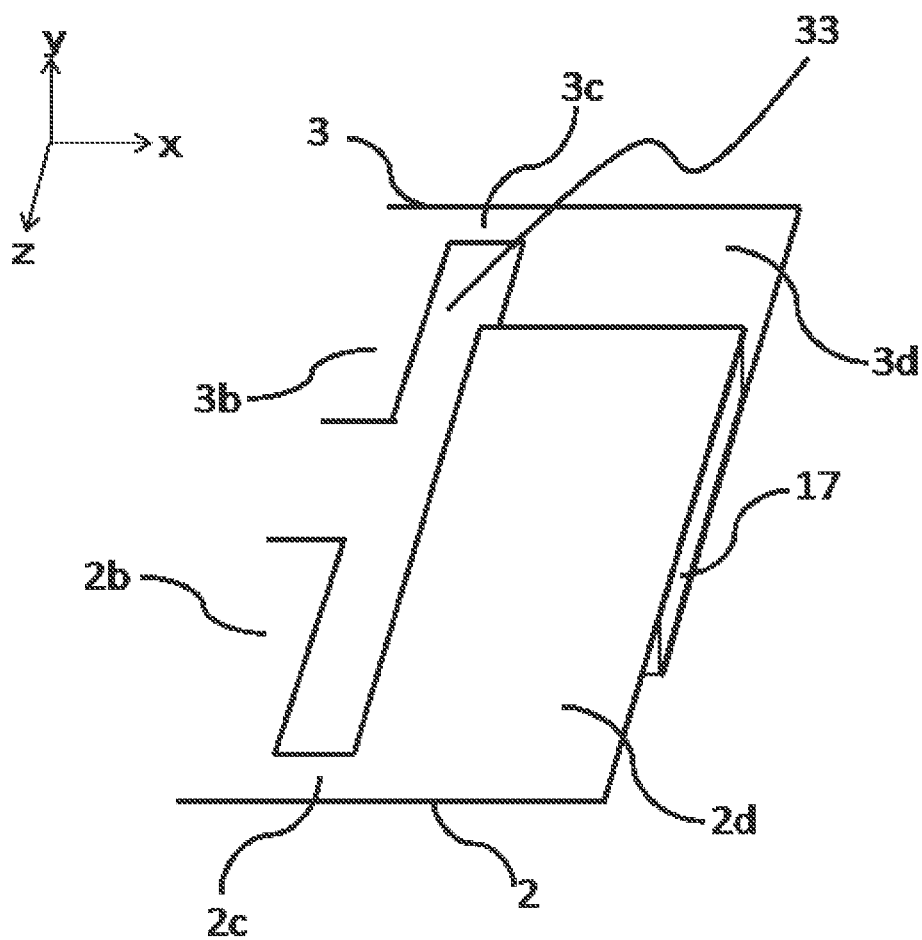
FIG. 18 is a perspective view showing the structure of a bus bar structure according to embodiment 8 of the present invention.
Figure 19:
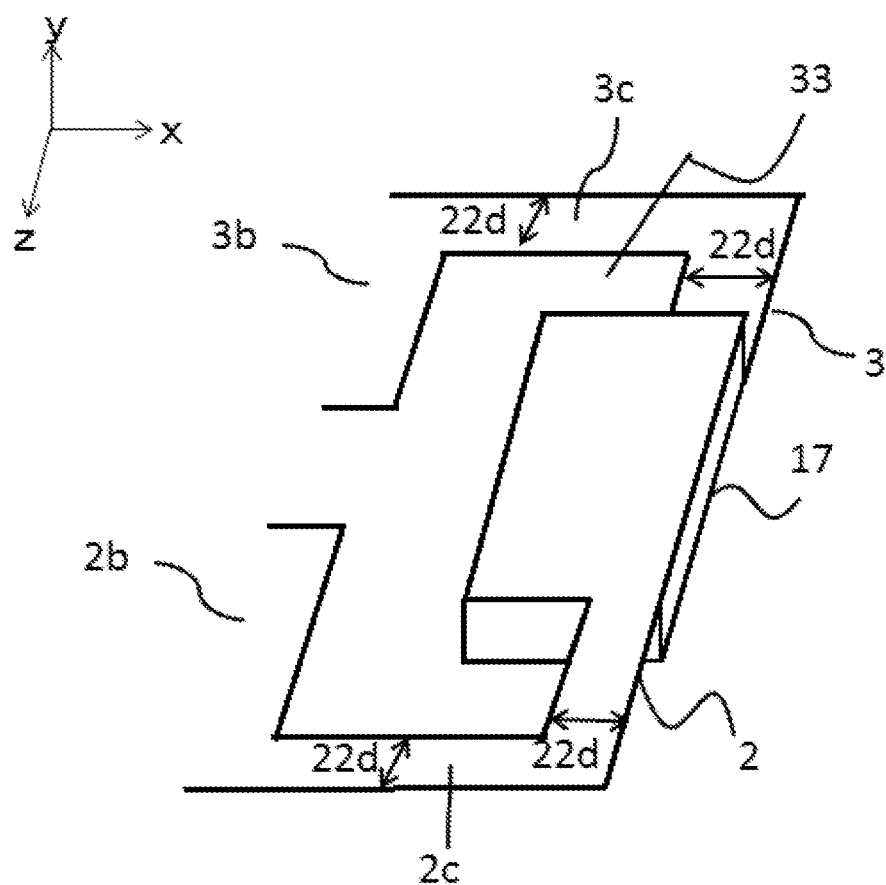
FIG. 19 is a perspective view showing the structure of a bus bar structure according to embodiment 9 of the present invention.

FIG. 18 and FIG. 19 are perspective views of a bus bar structure according to embodiment 8 of the present invention. In embodiment 8 of the present invention, the upper and lower bus bars 2, 3 are extended also in the z-axis direction from a position where the power module 17 is placed.

Embodiment 7 of the present invention has shown the case where a space margin in the z-axis direction exists only near the bus bars as shown in FIG. 17. Embodiment 8 of the present invention shows an example in which a space margin in the z-axis direction exists up to the vicinity of the power module 17 as shown in FIG. 18 and FIG. 19.

In this case, the second connection portion 2d of the upper bus bar 2 and the fourth connection portion 3d of the lower bus bar 3 which are connected to the power module 17 via electrodes are formed to respectively protrude in the positive direction and the negative direction of the z axis, and also by this structure, the inductance can be increased. In this case, as shown in FIG. 18, if the widths of the first bent portion 2c and the second bent portion 3c inevitably have to be smaller than about six times the skin thickness, the length of the part where the current density is high can be shortened by shortening the lengths of the first bent portion 2c and the second bent portion 3c, and thus it is also possible to suppress temperature increase.

Embodiment 9

FIG. 19 is a perspective view of a bus bar structure according to embodiment 9 of the present invention. In embodiment 9 of the present invention, the widths 22d of the first bent portion 2c and the second bent portion 3c are set to be equal to or smaller than six times the skin thickness, and the widths of the second connection portion 2d and the fourth connection portion 3d are also set to have the same width 22d, except for the part where the power module is placed. Thus, the opening 33 extends to reach behind the outer shape of the power module 17, whereby the area of the opening is enlarged and the inductance can be increased.

It is noted that, in the case of further enlarging the area of the opening, if there is some margin in the x-axis direction, the bus bars may be formed to extend around the periphery of the power module so as to be connected to the side surface, of the power module 17, that is opposite to the side facing the first connection portion 2b and the second connection portion 3b.

Embodiment 10

Figure 20A:
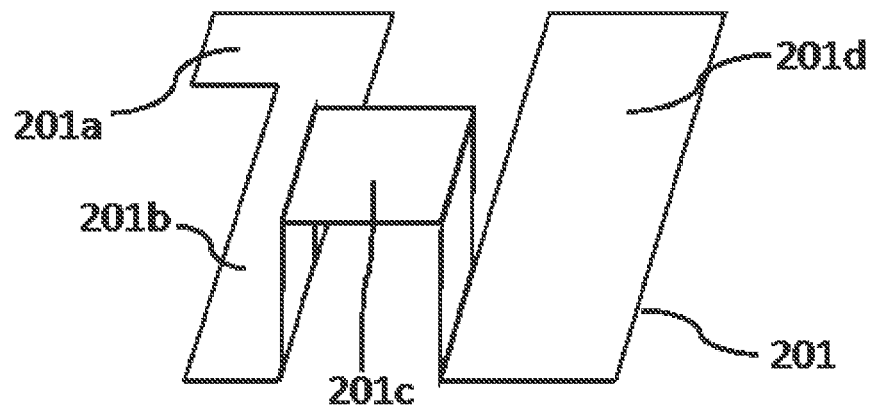
FIG. 20A is a perspective view of an upper bus bar of a bus bar structure according to embodiment 10 of the present invention.
Figure 20B:
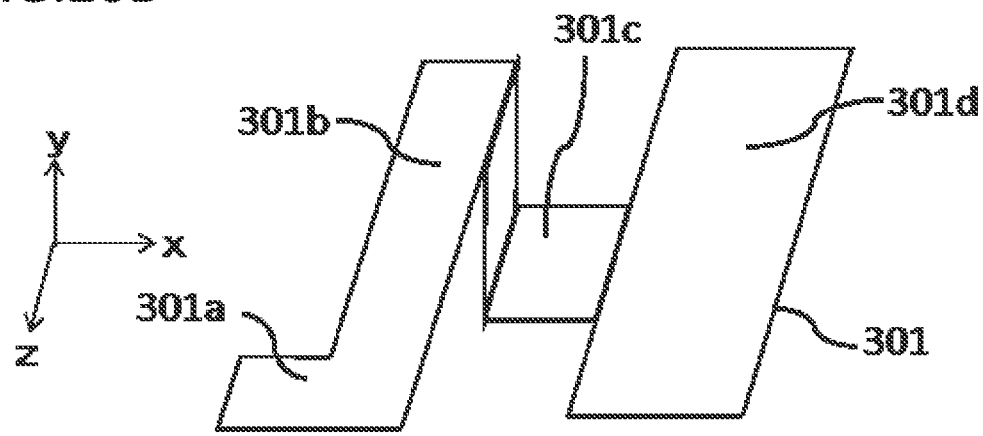
FIG. 20B is a perspective view of a lower bus bar of the bus bar structure according to embodiment 10 of the present invention.
Figure 20C:
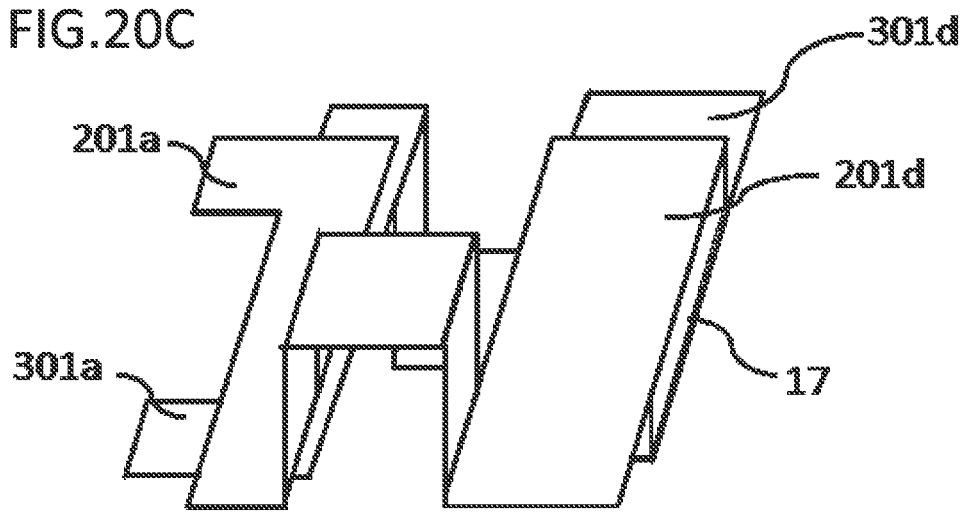
FIG. 20C is a perspective view showing a combination of the upper bus bar and the lower bus bar of the bus bar structure according to embodiment 10 of the present invention.
Figure 21A:
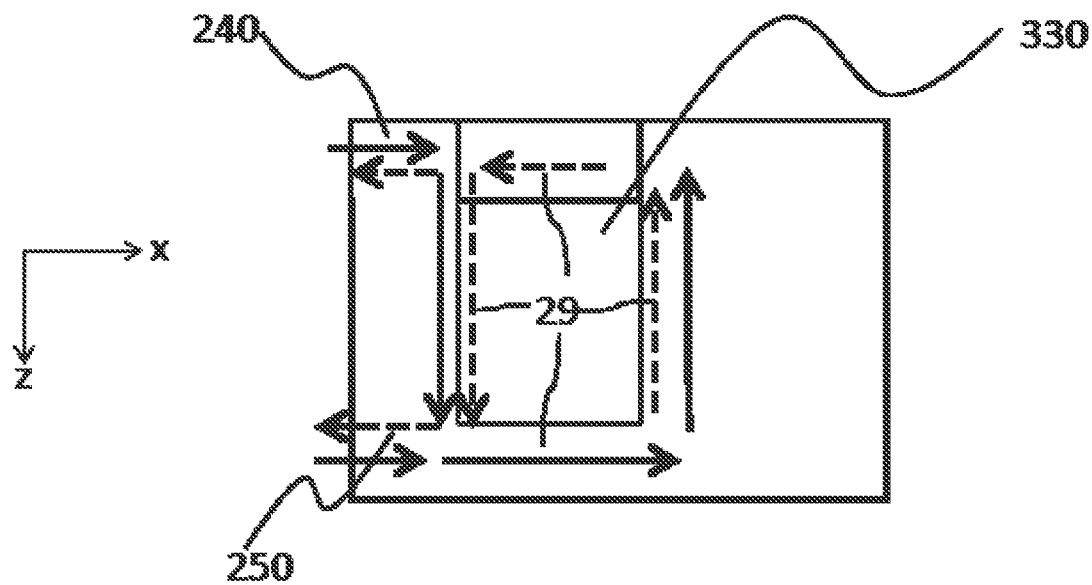
FIG. 21A is a plan view showing a current route in the bus bar structure having the structure shown in FIG. 20C.
Figure 21B:
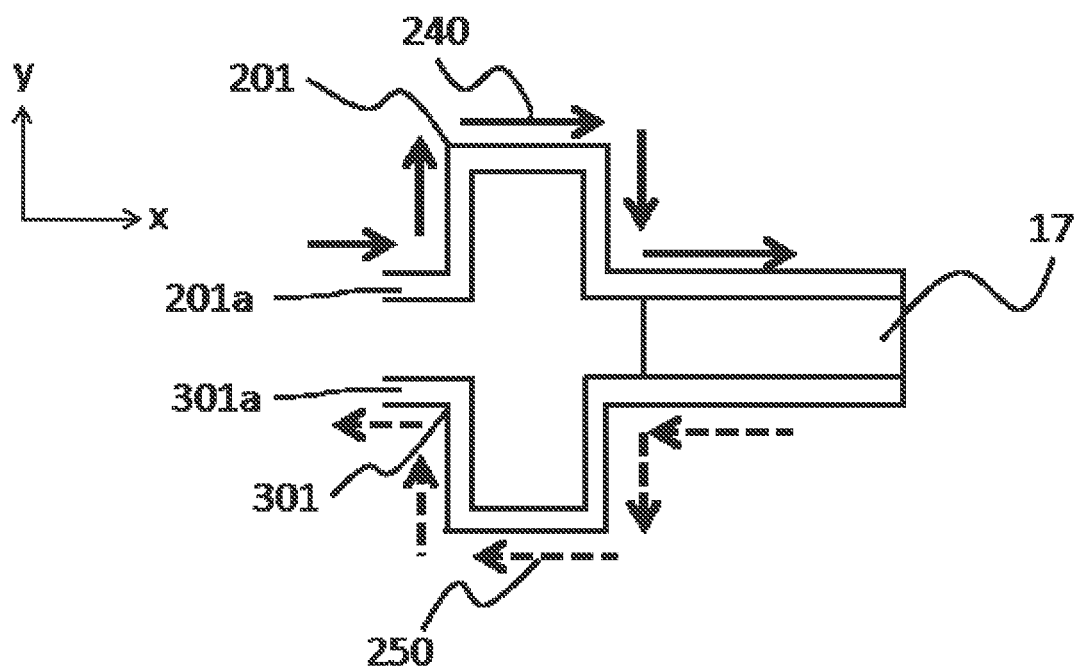
FIG. 21B is a side view showing a current route in the bus bar structure having the structure shown in FIG. 20C.

FIG. 20A, FIG. 20B, and FIG. 20C are perspective views of a bus bar structure according to embodiment 10 of the present invention. In embodiment 10 of the present invention, in the case where there is some margin in the y-axis direction, the bus bars are extended also in this direction. FIG. 20A is a perspective view of an upper bus bar 201 having a first bent portion 201c extended in the positive direction of the y axis, and FIG. 20B is a perspective view of a lower bus bar 301 having a second bent portion 301c extended in the negative direction of the y axis. FIG. 20C is a perspective view showing a combination of the upper bus bar 201 and the lower bus bar 301. In order to show an inductance increasing effect in this case, FIG. 21A shows a plan view of the combination of the upper bus bar 201 and the lower bus bar 301 shown in FIG. 20C, and FIG. 21B shows a view thereof as seen from the lateral side. In embodiment 10 of the present invention, a first end 201a, a first connection portion 201b, the first bent portion 201c, and a second connection portion 201d respectively correspond to the first end 2a, the first connection portion 2b, the first bent portion 2c, and the second connection portion 2d in FIG. 1, and a second end 301a, a third connection portion 301b, the second bent portion 301c, and a fourth connection portion 301d respectively correspond to the second end 3a, the third connection portion 3b, the second bent portion 3c, and the fourth connection portion 3d in FIG. 1.

As in the case shown in FIG. 2 in embodiment 1 of the present invention, an external device (not shown) such as a motor or a power supply is connected to the first end 201a and the second end 301a, and the power module 17 is connected to the second connection portion 201d and the fourth connection portion 301d.

FIG. 21A is a plan view similar to FIG. 10B shown in embodiment 2 of the present invention. Currents flow around an opening 330, and a one-turn loop 29 of a current path is formed by upper bus bar current 240 and lower bus bar current 250.

In FIG. 21B, as seen in the z-axis direction, a current loop is not closed at the first end 201a and the second end 301a, but a current path loop which is approximately a one-turn loop is formed by the upper bus bar current 240 and the lower bus bar current 250. That is, one-turn loops of current paths are formed in both of the x-axis direction and the y-axis direction, whereby an increased inductance effect is obtained and short-circuit current can be further reduced.

Embodiment 11

When short-circuit current flows in the bus bar structure 1 in embodiment 1 of the present invention, a repulsive electromagnetic force occurs between the upper bus bar 2 and the lower bus bar 3, and the bus bars might be deformed by the repulsive electromagnetic force. In embodiment 11 of the present invention, a bus bar fixing member is provided around the bus bars in order to suppress movement and deformation of the bus bars.

Figure 22A:
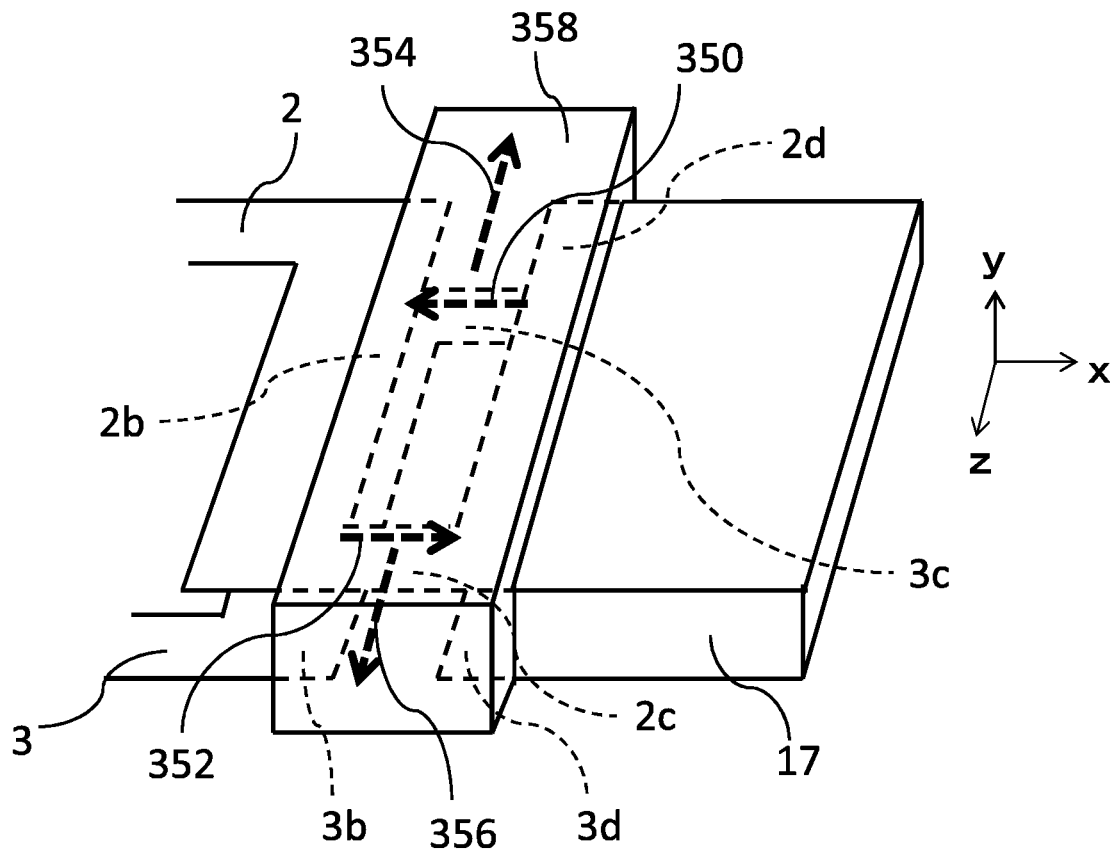
FIG. 22A is a perspective view showing the structure of a bus bar structure according to embodiment 11 of the present invention.
Figure 22B:
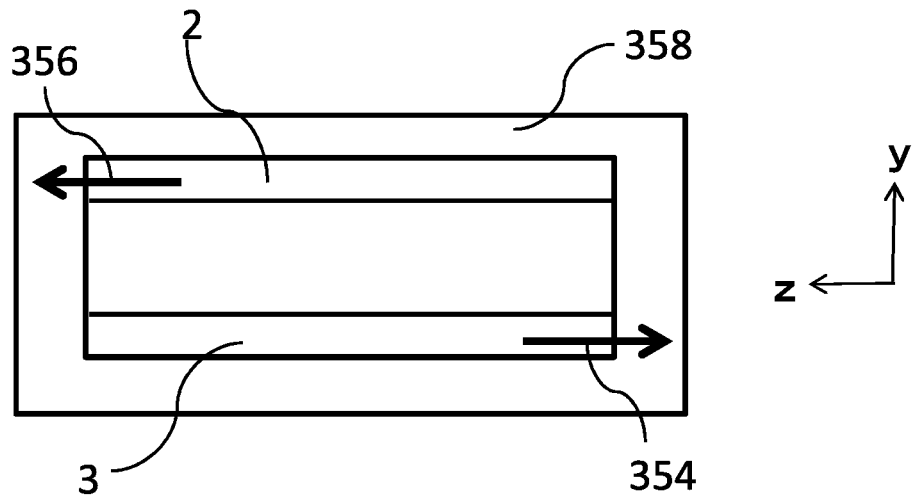
FIG. 22B is a side view of the bus bar structure according to embodiment 11 of the present invention, as seen in an x-axis direction.

FIG. 22A and FIG. 22B show a bus bar structure according to embodiment 11 of the present invention. In FIG. 22A, an arrow 350 and an arrow 352 indicate bus bar currents flowing oppositely to each other. Due to the opposite currents along the x-axis direction, a repulsive electromagnetic force occurs in the z-axis direction. An arrow 354 and an arrow 356 indicate repulsive electromagnetic forces in the z-axis direction that are caused by the bus bar currents. As a mechanism for suppressing the repulsive electromagnetic forces, a bus bar fixing member 358 is provided. The bus bar fixing member 358 covers the first connection portion 2b, the first bent portion 2c, and the second connection portion 2d of the upper bus bar 2, and the third connection portion 3b, the second bent portion 3c, and the fourth connection portion 3d of the lower bus bar 3. The bus bar fixing member 358 is formed by, for example, resin or ceramic electrically insulated from the upper bus bar 2 and the lower bus bar 3.

FIG. 22B is a side view of the bus bar structure shown in FIG. 22A, as seen in the x-axis direction. As shown in FIG. 22B, the bus bar fixing member 358 covers the z-axis-direction outer peripheries of the upper bus bar 2 and the lower bus bar 3, and thus can suppress movement and deformation of the upper bus bar 2 and the lower bus bar 3 due to the z-axis-direction electromagnetic repulsive forces acting on the upper bus bar 2 and the lower bus bar 3 as indicated by the arrow 354 and the arrow 356.

Figure 22C:
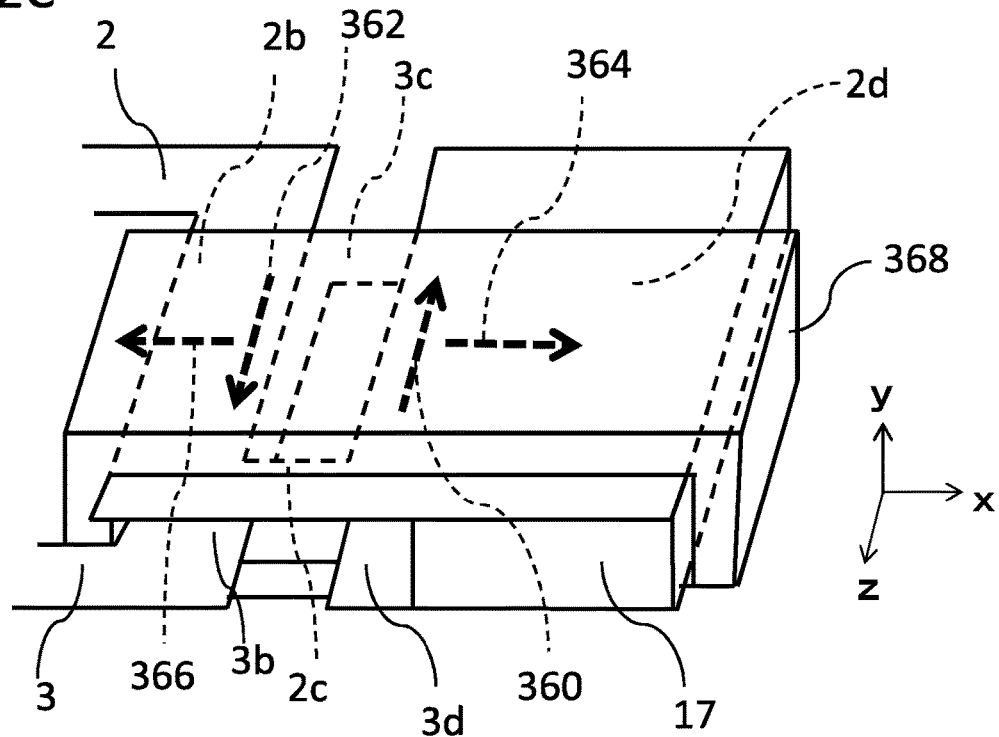
FIG. 22C is a perspective view showing the structure of another bus bar structure according to embodiment 11 of the present invention.

FIG. 22C shows another bus bar structure according to embodiment 11 of the present invention. In FIG. 22C, a bus bar fixing member 368 covers: the first connection portion 2*b*, the first bent portion 2*c*, and the second connection portion 2*d* of the upper bus bar 2; the third connection portion 3*b*, the second bent portion 3*c*, and the fourth connection portion 3*d* of the lower bus bar 3; and the power module 17. In FIG. 22C, an arrow 360 and an arrow 362 indicate upper bus bar currents flowing in directions opposite to each other in the z-axis direction through the first connection portion 2*b* and the second connection portion 2*d* of the upper bus bar 2. Due to the opposite currents in the z-axis direction, the repulsive electromagnetic forces directed in directions opposite to each other in the x-axis direction as indicated by the arrows 364 and 366 occur on the upper bus bar 2. As in the upper bus bar 2, repulsive electromagnetic forces directed in directions opposite to each other in the x-axis direction occur also on the lower bus bar 3.

Figure 22D:
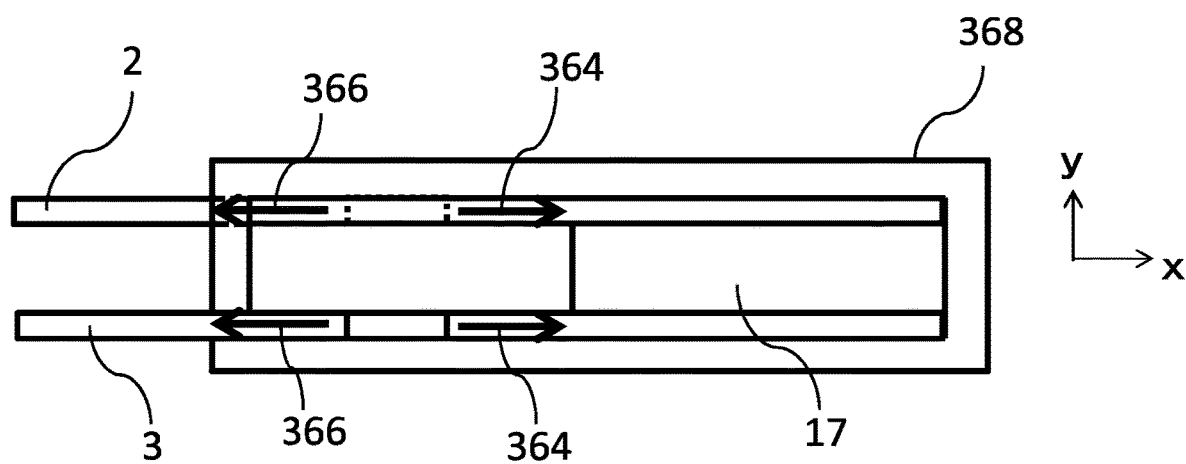
FIG. 22D is a side view of the bus bar structure according to embodiment 11 of the present invention, as seen in a z-axis direction.

FIG. 22D is a side view of the bus bar structure shown in FIG. 22C, as seen in the z-axis direction. As shown in FIG. 22D, the bus bar fixing member 368 covers the x-axis-direction outer peripheries of the upper bus bar 2 and the lower bus bar 3, and thus can suppress movement and deformation of the upper bus bar 2 and the lower bus bar 3 due to the repulsive electromagnetic forces acting on the upper bus bar 2 and the lower bus bar 3 in directions opposite to each other in the x-axis direction.

As described above, in the bus bar structure according to embodiment 11 of the present invention, the z-axis-direction outer peripheries or the x-axis-direction outer peripheries of the upper bus bar 2 and the lower bus bar 3 are covered with the bus bar fixing member 368, whereby it is possible to suppress movement and deformation of the bus bars caused by electromagnetic repulsive forces occurring when short-circuit current flows.

Embodiment 11 of the present invention has shown an example in which the z-axis-direction outer peripheries or the x-axis-direction outer peripheries of the upper bus bar 2 and the lower bus bar 3 are covered with the bus bar fixing member. However, a structure in which the z-axis-direction outer peripheries and the x-axis-direction outer peripheries are both covered may be employed. Embodiment 11 of the present invention has shown an example in which the bus bar fixing member 368 is formed by resin or ceramic. However, the bus bar fixing member 368 may be formed by a nonmagnetic material electrically insulated from the upper bus bar 2 and the lower bus bar 3.

Embodiment 12

In embodiments 1 to 9 of the present invention, the upper bus bar 2 and the lower bus bar 3 are formed to be flat with respect to x-z plane. In a bus bar structure according to embodiment 12 of the present invention, an upper bus bar and a lower bus bar have bent portions in the y-axis direction.

Figure 23A:
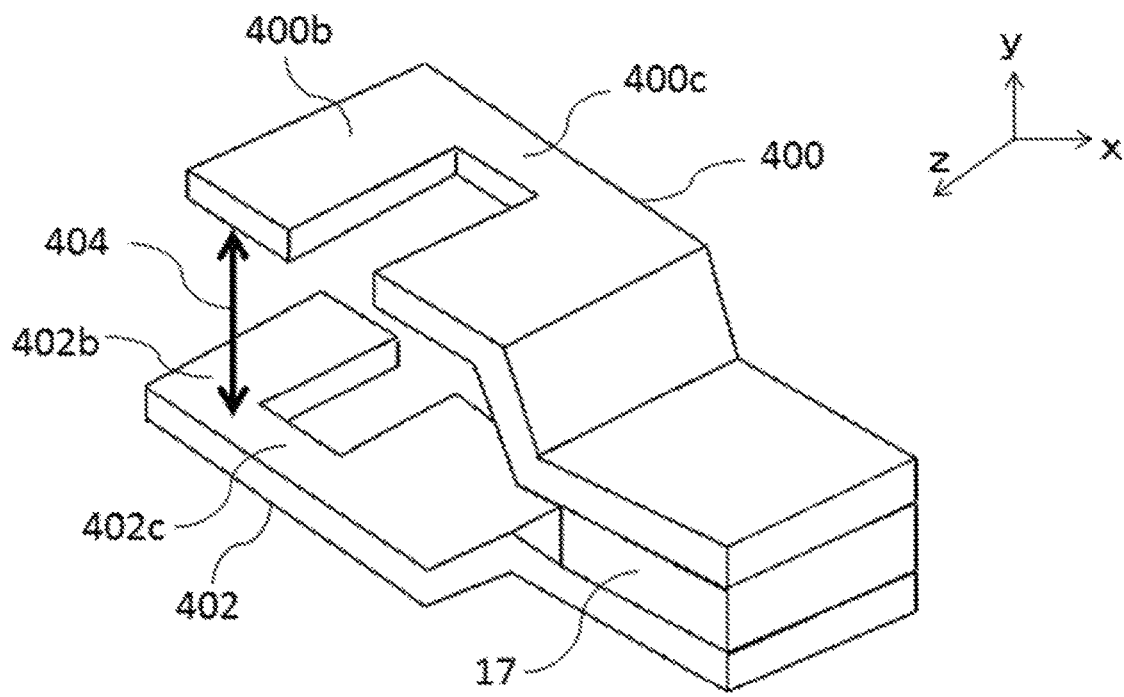
FIG. 23A is a perspective view showing the structure of a bus bar structure according to embodiment 12 of the present invention.

FIG. 23A is a perspective view showing the bus bar structure according to embodiment 12 of the present invention. In the bus bar structure of embodiment 12 of the present invention, as shown in FIG. 23A, a gap 404 between: a first connection portion 400*b* and a first bent portion 400*c* of an upper bus bar 400; and a third connection portion 402*b* and a second bent portion 402*c* of a lower bus bar 402 which are opposed to the first connection portion 400*b* and the first bent portion 400*c* in the y-axis direction, is wider than the thickness in the y-axis direction of the power module 17.

Figure 23B:
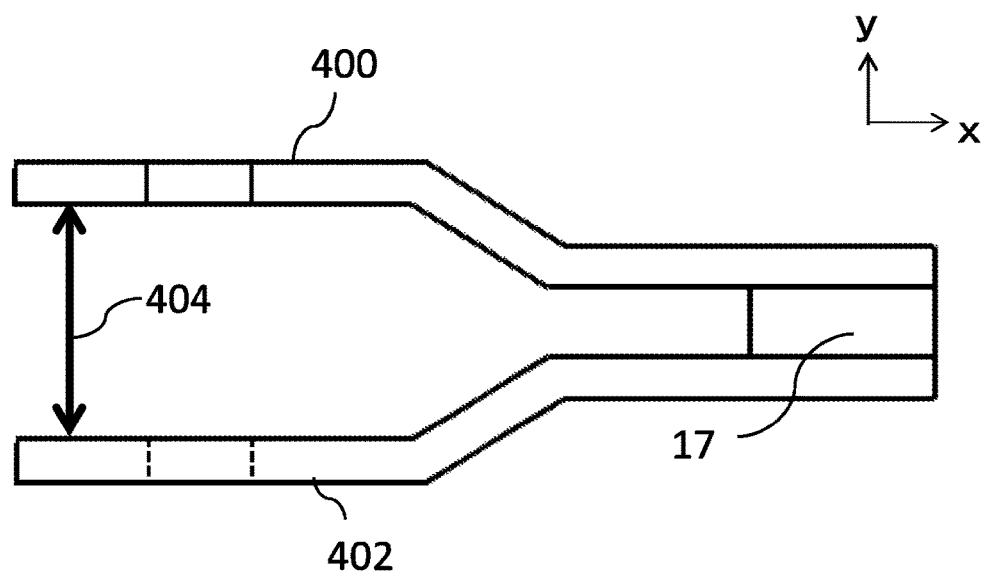
FIG. 23B is a side view of the bus bar structure according to embodiment 12 of the present invention, as seen in the z-axis direction.

FIG. 23B is a side view of the bus bar structure shown in FIG. 23A, as seen in the z-axis direction. As shown in FIG. 23B, the upper bus bar 400 is bent in the positive direction of the y axis as being separated in the x-axis direction from the power module 17, and the lower bus bar 402 is bent in the negative direction of the y axis as being separated in the x-axis direction from the power module 17. As a result, the gap 404 between the upper bus bar 400 and the lower bus bar 402 is wider than the thickness in the y-axis direction of the power module 17.

In the bus bar structure configured as described above, the gap expands with increase in the distance from the power module, whereby the inductance between the bus bars increases and the short-circuit current reducing effect increases.

Embodiment 12 of the present invention has shown an example in which the upper bus bar 400 is bent in the positive direction of the y axis as being separated in the x-axis direction from the power module 17 and the lower bus bar 402 is bent in the negative direction of the y axis as being separated in the x-axis direction from the power module 17. However, only one of the bus bars may be bent so that the gap 404 between the upper bus bar 400 and the lower bus bar 402 becomes wider than the thickness in the y-axis direction of the power module 17.

Figure 24A:
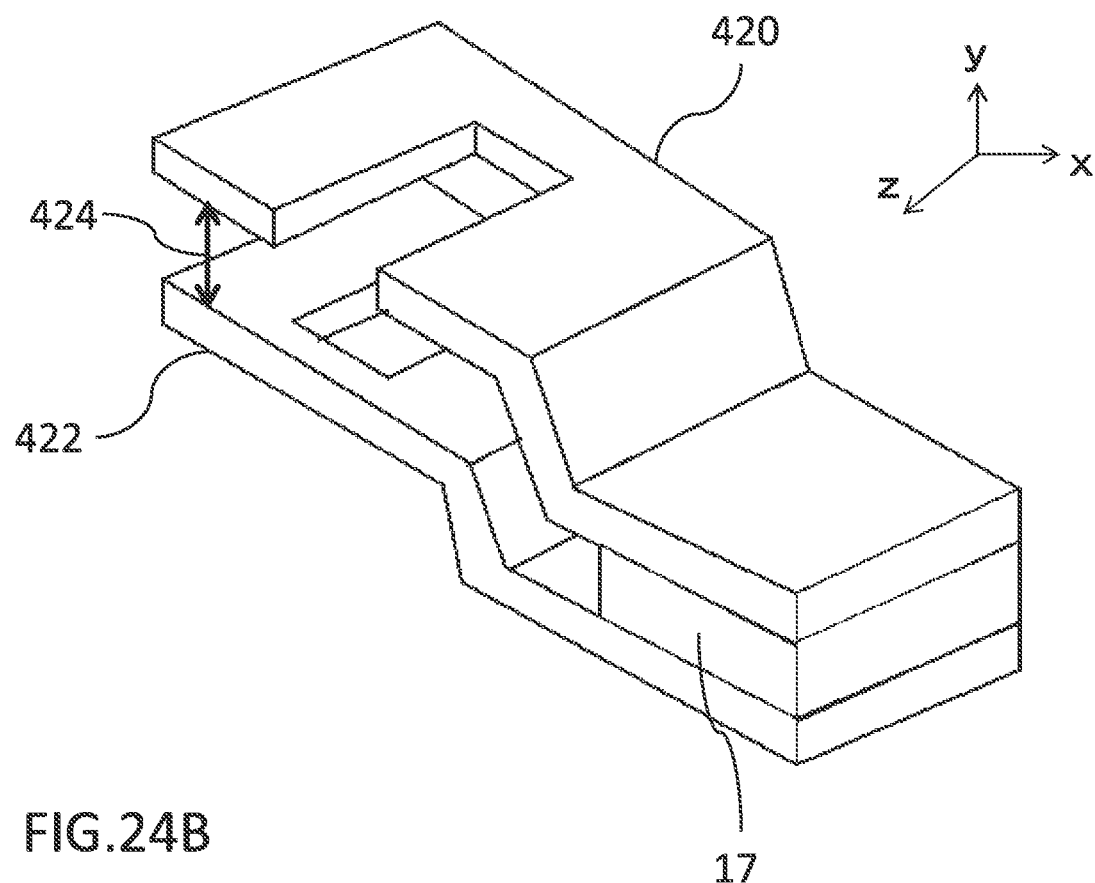
FIG. 24A is a perspective view showing the structure of another bus bar structure according to embodiment 12 of the present invention.

FIG. 24A shows another bus bar structure according to embodiment 12 of the present invention. In FIG. 24A, the gap between an upper bus bar 420 and a lower bus bar 422 is constant, and the upper bus bar 420 and the lower bus bar 422 are partially bent toward the same side in the y-axis direction.

Figure 24B:
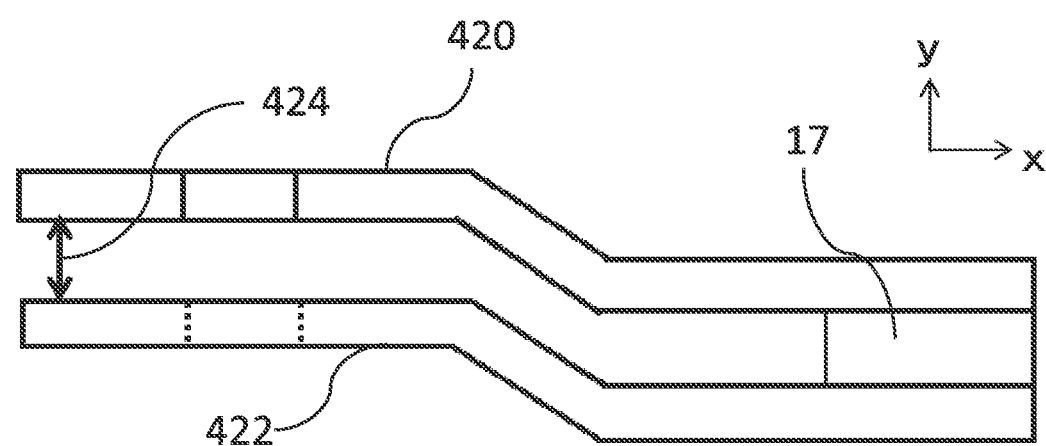
FIG. 24B is a side view of another bus bar structure according to embodiment 12 of the present invention, as seen in the z-axis direction.

FIG. 24B is a side view of the bus bar structure shown in FIG. 24A, as seen in the z-axis direction. As shown in FIG. 24B, a gap 424 between the upper bus bar 420 and the lower bus bar 422 is equal to the thickness in the y-axis direction of the power module 17.

The bus bar structure configured as described above is effective for the case where the position in the y-axis direction of the first device and the position in the y-axis direction of the power module 17 are different from each other.

Figure 25A:
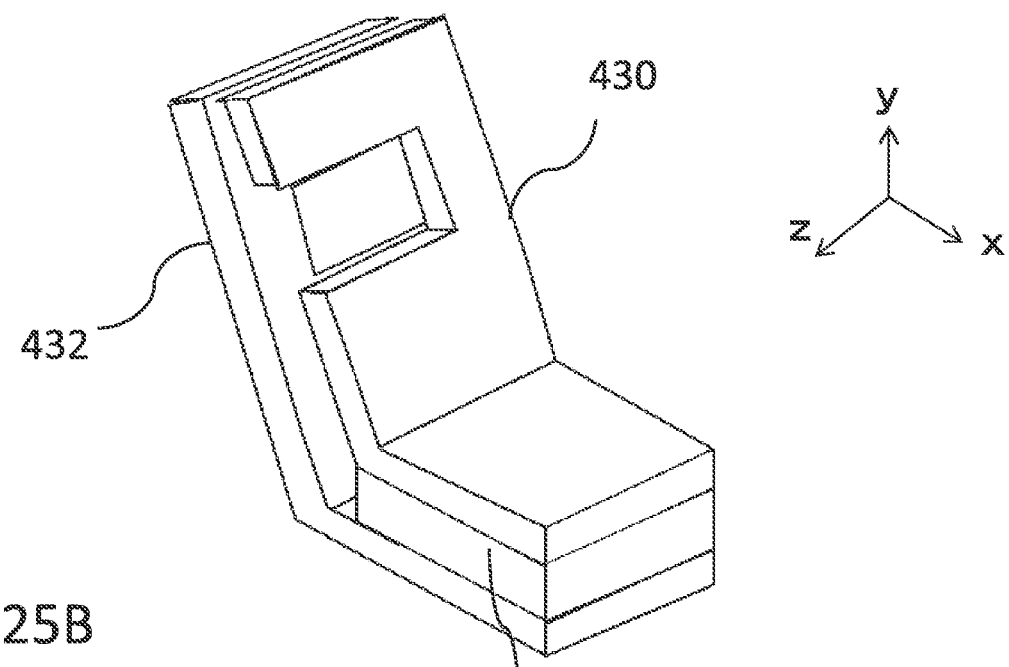
FIG. 25A is a perspective view showing the structure of another bus bar structure according to embodiment 12 of the present invention.

FIG. 25A shows another bus bar structure according to embodiment 12 of the present invention. In FIG. 25A, the gap between an upper bus bar 430 and a lower bus bar 432 is constant, and the upper bus bar 430 and the lower bus bar 432 are bent toward the same side in the y-axis direction.

Figure 25B:
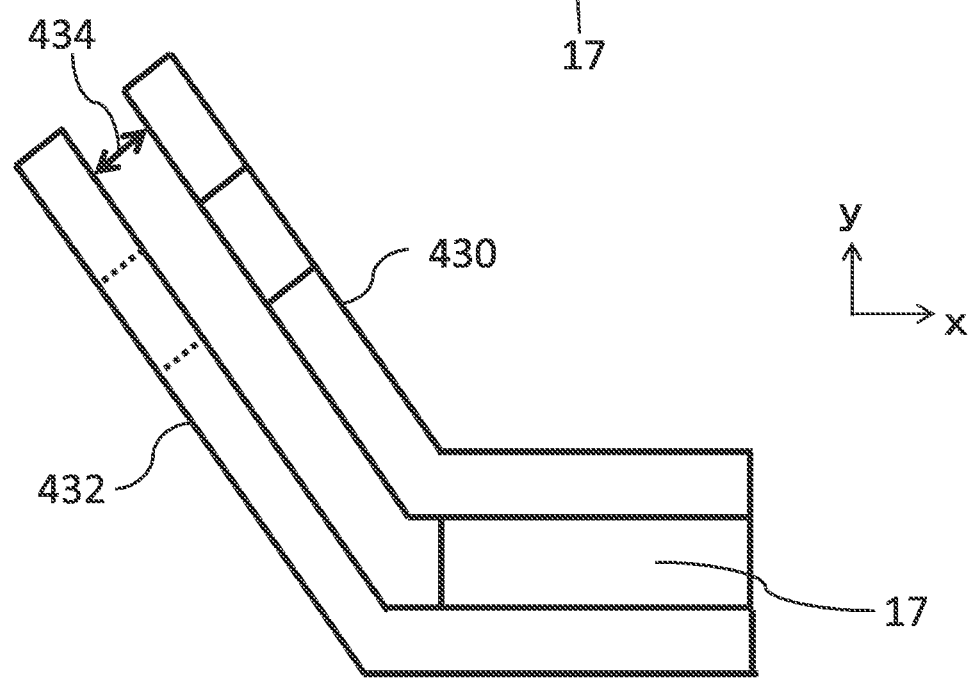
FIG. 25B is a side view of another bus bar structure according to embodiment 12 of the present invention, as seen in the z-axis direction.

FIG. 25B is a side view of the bus bar structure shown in FIG. 25A, as seen in the z-axis direction. As shown in FIG. 25B, a gap 434 between the upper bus bar 430 and the lower bus bar 432 is equal to the thickness in the y-axis direction of the power module 17.

The bus bar structure configured as described above is effective for the case where the first device is placed so as to be inclined with respect to the power module 17.

Figure 26A:
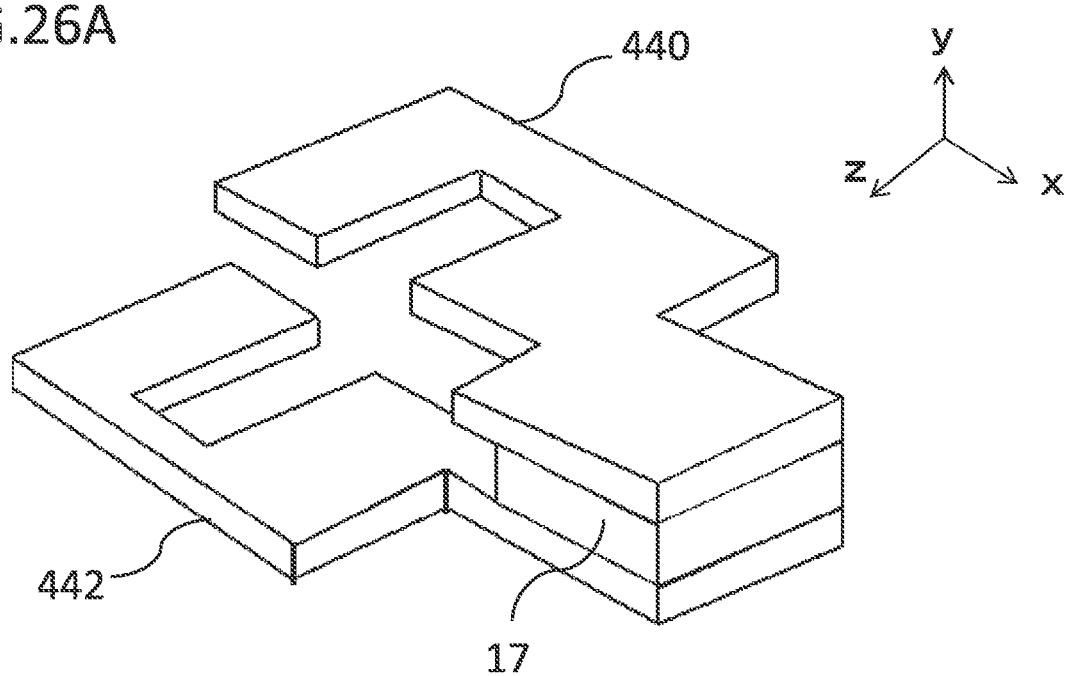
FIG. 26A is a perspective view showing the structure of another bus bar structure according to embodiment 12 of the present invention.

FIG. 26A shows another bus bar structure according to embodiment 12 of the present invention. In the bus bar structures shown in FIG. 22 to FIG. 25, examples in which the bus bars are bent in the y-axis direction have been shown. In the other bus bar structure shown in FIG. 26A, the bus bars are bent in the z-axis direction. In FIG. 26A, an upper bus bar 440 and a lower bus bar 442 are bent so as to be mutually separated in the z-axis direction from the power module 17.

Figure 26B:
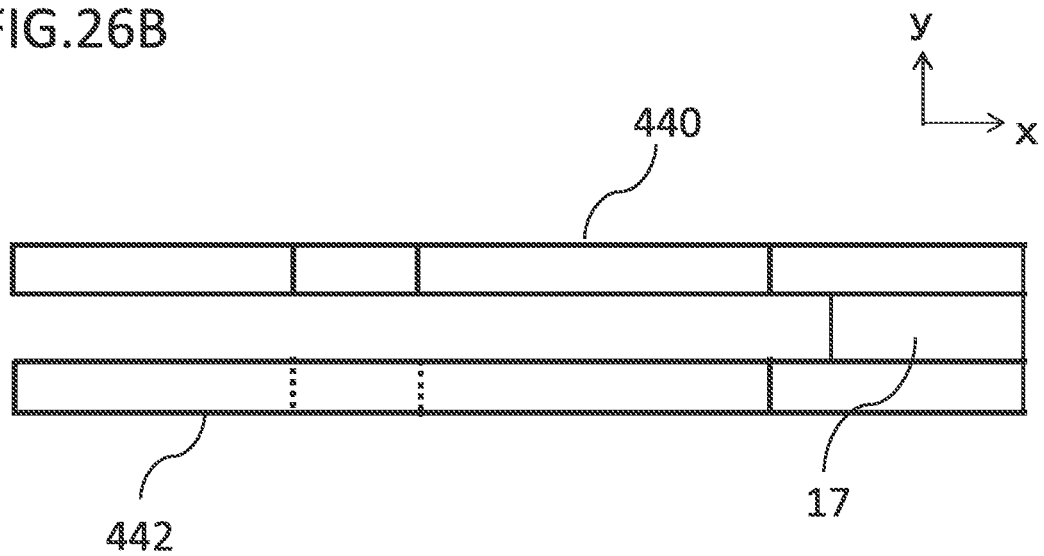
FIG. 26B is a side view of another bus bar structure according to embodiment 12 of the present invention, as seen in the z-axis direction.

FIG. 26B is a side view of the bus bar structure shown in FIG. 26A, as seen in the z-axis direction. The gap in the y-axis direction between the upper bus bar 440 and the lower bus bar 442 is constant. However, as shown in FIG. 26A, in the z-axis direction, the upper bus bar 440 and the lower bus bar 442 are bent so as to be separated from each other, and therefore the gap between the upper bus bar 440 and the lower bus bar 442 expands, whereby the inductance between the bus bars increases and the short-circuit current reducing effect increases.

In the bus bar structure shown in FIG. 26A, an example in which each bus bar is bent in the z-axis direction at one location has been shown. However, the bus bars may be bent sequentially in the x-axis direction so as to be separated from the power module.

Figure 27A:
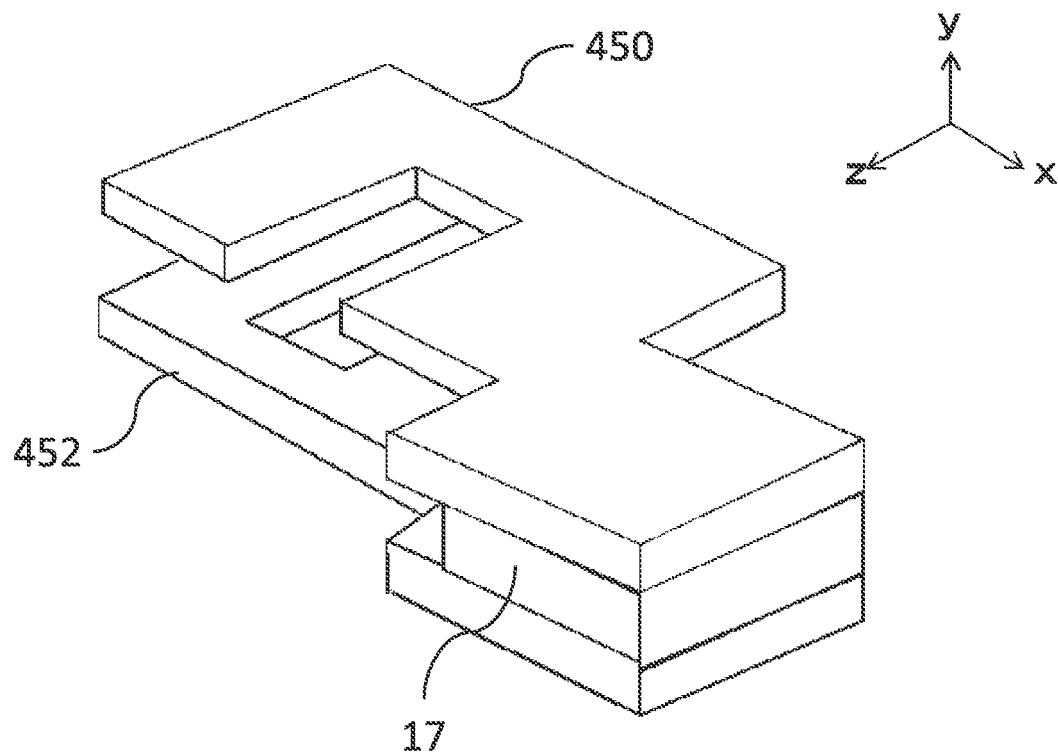
FIG. 27A is a perspective view showing the structure of another bus bar structure according to embodiment 12 of the present invention.

FIG. 27A shows another bus bar structure according to embodiment 12 of the present invention. In the other bus bar structure shown in FIG. 27A, the bus bars are bent in the z-axis direction. In FIG. 27A, the upper bus bar 450 and the lower bus bar 452 are bent toward the same side so as to be separated in the z-axis direction from the power module 17.

Figure 27B:
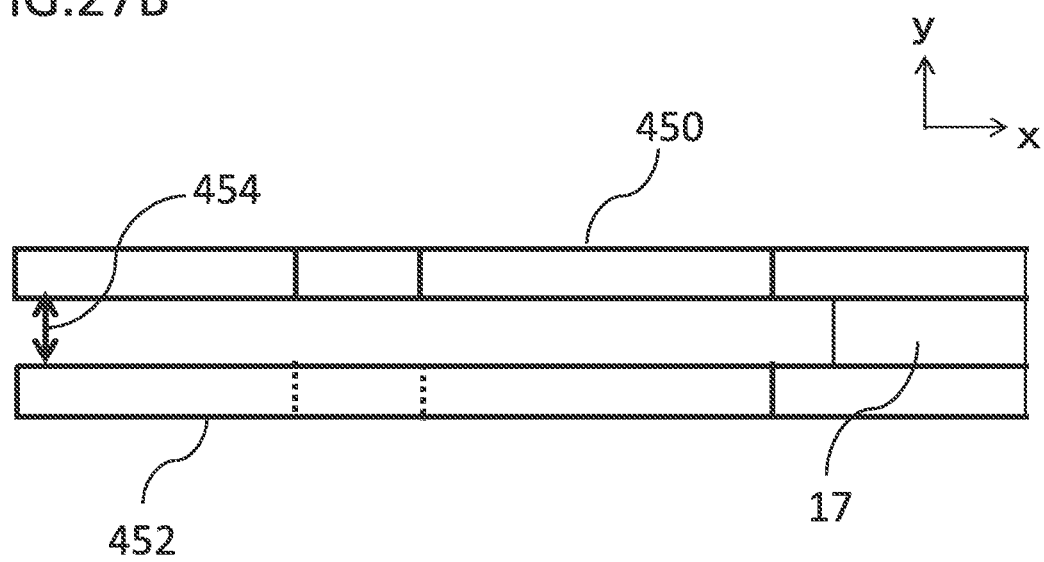
FIG. 27B is a side view of another bus bar structure according to embodiment 12 of the present invention, as seen in the z-axis direction.

FIG. 27B is a side view of the bus bar structure shown in FIG. 27A, as seen in the z-axis direction. As shown in FIG. 27B, a gap 454 between the upper bus bar 450 and the lower bus bar 452 is equal to the thickness in the y-axis direction of the power module 17.

The bus bar structure configured as described above is effective for the case where the position in the z-axis direction of the first device and the position in the z-axis direction of the power module 17 are different from each other.

Embodiment 13

Figure 28A:
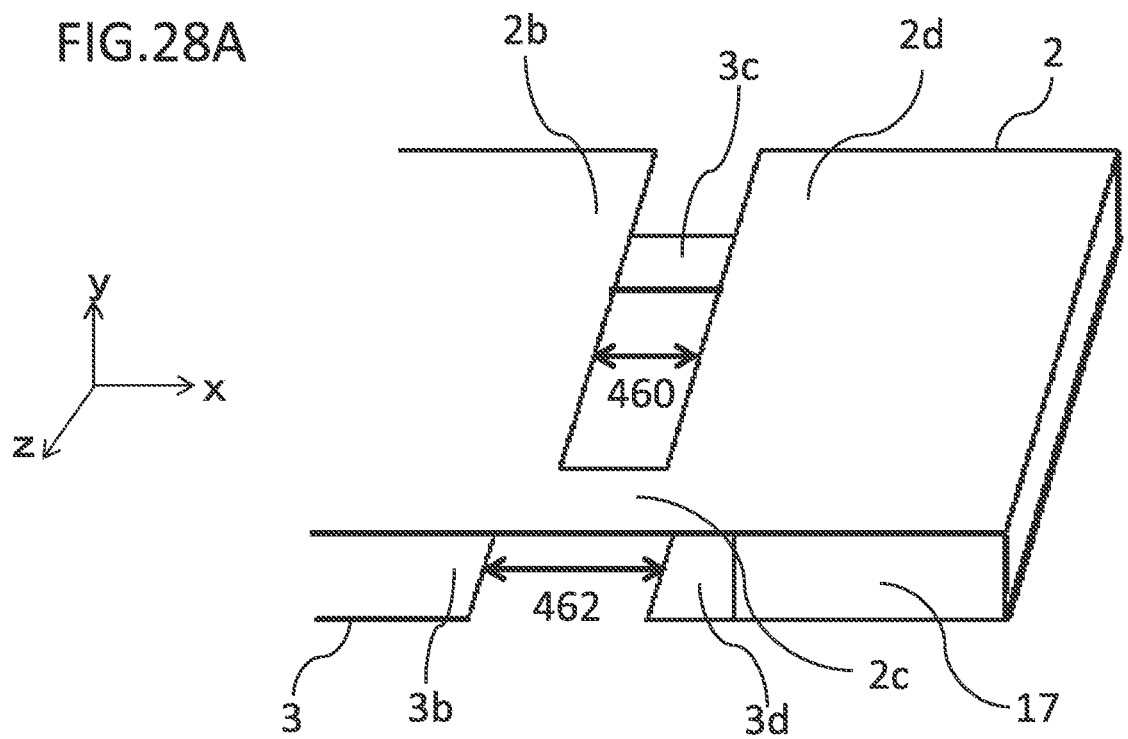
FIG. 28A is a perspective view showing the structure of a bus bar structure according to embodiment 13 of the present invention.

FIG. 28A shows a bus bar structure according to embodiment 13 of the present invention. In this bus bar structure, a space surrounded by the first connection portion 2b, the first bent portion 2c, and the second connection portion 2d is a cutout of the upper bus bar 2. Similarly, a space surrounded by the third connection portion 3b, the second bent portion 3c, and the fourth connection portion 3d is a cutout of the lower bus bar 3. A width 460 in the x-axis direction of the cutout of the upper bus bar 2 is set to be smaller than a width 462 in the x-axis direction of the cutout of the lower bus bar 3.

Figure 28B:
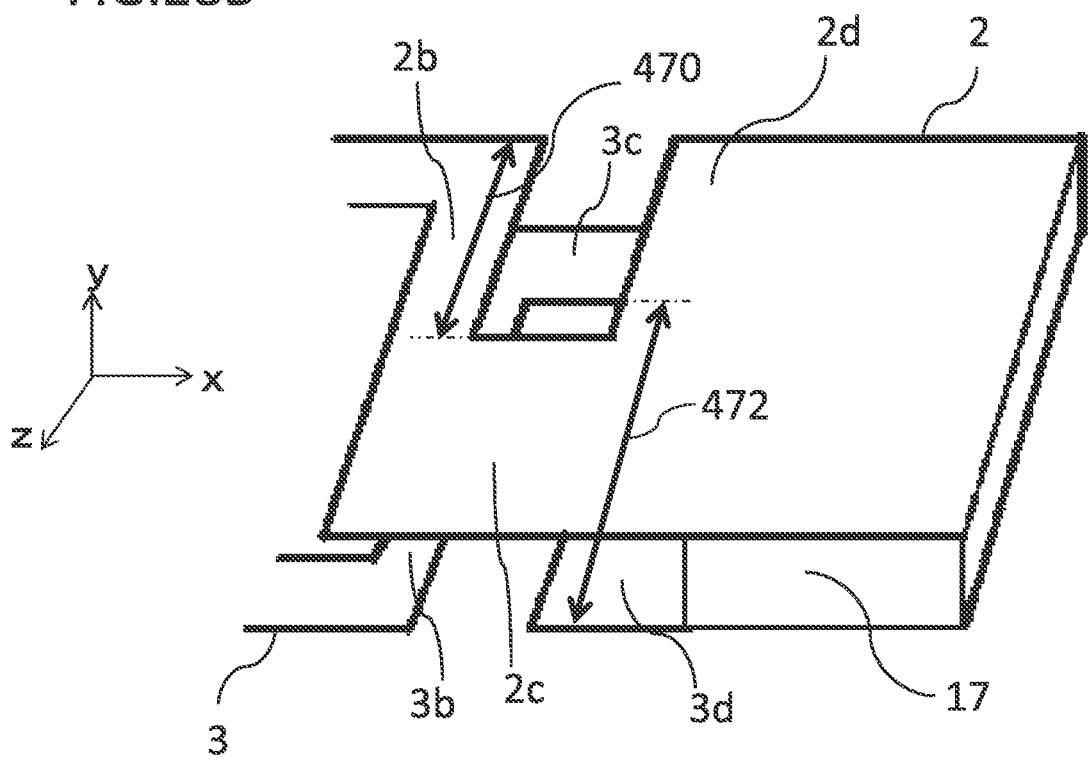
FIG. 28B is a perspective view showing the structure of another bus bar structure according to embodiment 13 of the present invention.

FIG. 28B shows another bus bar structure according to embodiment 13 of the present invention. In this other bus bar structure, a space surrounded by the first connection portion 2b, the first bent portion 2c, and the second connection portion 2d is a cutout of the upper bus bar 2. Similarly, a space surrounded by the third connection portion 3b, the second bent portion 3c, and the fourth connection portion 3d is a cutout of the lower bus bar 3. A width 470 in the z-axis direction of the cutout of the upper bus bar 2 is set to be smaller than a width 472 in the z-axis direction of the cutout of the lower bus bar 3.

Figure 28C:
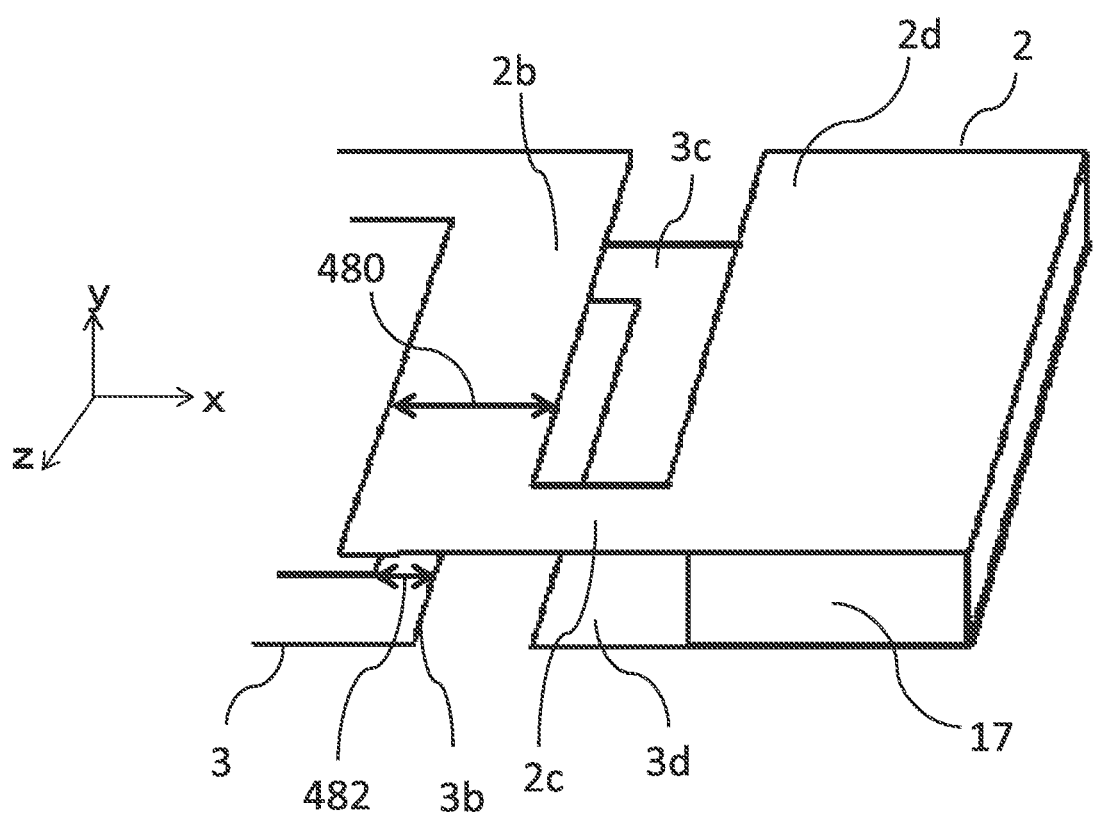
FIG. 28C is a perspective view showing the structure of another bus bar structure according to embodiment 13 of the present invention.

FIG. 28C shows still another bus bar structure according to embodiment 13 of the present invention. In this other bus bar structure shown in FIG. 28C, a space surrounded by the first connection portion 2b, the first bent portion 2c, and the second connection portion 2d is a cutout of the upper bus bar 2. Similarly, a space surrounded by the third connection portion 3b, the second bent portion 3c, and the fourth connection portion 3d is a cutout of the lower bus bar 3. In this bus bar structure, a width 480 in the x-axis direction of the first connection portion of the upper bus bar 2 is different from a width 482 in the x-axis direction of the third connection portion of the lower bus bar 3, that is, the width 480 of the upper bus bar 2 is greater than the width 482 of the lower bus bar 3. Therefore, the cutout of the upper bus bar and the cutout of the lower bus bar are formed to be shifted from each other in the x-axis direction.

In the bus bar structures shown in FIG. 28A, FIG. 28B, and FIG. 28C in embodiment 13 of the present invention, the inductance between the upper bus bar 2 and the lower bus bar 3 increases owing to the above-described configuration, whereby a short-circuit current reducing effect is obtained.

It is noted that, within the scope of the present invention, the above embodiments may be freely combined with each other, or each of the above embodiments may be modified or simplified as appropriate. The same reference characters denote parts having the same or corresponding configurations or functions.

DESCRIPTION OF THE REFERENCE CHARACTERS 2, 15, 201, 400, 420, 430, 440, 450 upper bus bar
2a, 201a first end
2b, 201b first connection portion
2c, 201c first bent portion
2d, 201d second connection portion
2e third end
3, 16, 301, 402, 422, 432, 442, 452 lower bus bar
3a, 301a second end
3b, 301b third connection portion
3c, 301c second bent portion
3d, 301d fourth connection portion
3e fourth end
6 first device
7 second device
17 power module
19 chip
33 opening
35 capacitor
39 snubber capacitor
358, 368 bus bar fixing member

The invention claimed is:
1. A bus bar structure connected between a first device and a second device and comprising a first bus bar and a second bus bar arranged so as to be opposed to each other in a direction of a y axis perpendicular to a direction of an x axis, the direction of the x axis being a connection direction between the first device and the second device, wherein
  with a direction of a z axis defined as a direction perpendicular to the direction of the x axis and the direction of the y axis, the first bus bar includes:
    a first connection portion connected to the first device via a first end and extending in a positive direction of the z axis from the first end;
    a first bent portion bent in a positive direction of the x axis with respect to the first connection portion; and
    a second connection portion bent in a negative direction of the z axis with respect to the first bent portion and connected to the second device,
  the second bus bar includes:

a third connection portion connected to the first device via a second end and extending in the negative direction of the z axis from the second end;

a second bent portion bent in the positive direction of the x axis with respect to the third connection portion; and a fourth connection portion bent in the positive direction of the z axis with respect to the second bent portion and connected to the second device, the first bent portion and the second bent portion are arranged at positions shifted from each other in the direction of the z axis, an opening is formed which is surrounded by the first connection portion, the first bent portion, the second connection portion, the third connection portion, the second bent portion, and the fourth connection portion, and the connection to the first device and the second device is made such that a direction of current flowing from the first device via the first bus bar to the second device and a direction of current flowing from the second device via the second bus bar to the first device are opposite to each other.

2. The bus bar structure according to claim 1, wherein the first end and the second end are bent in a negative direction of the x axis with respect to the first connection portion and the third connection portion.

3. The bus bar structure according to claim 1, wherein the second connection portion and the fourth connection portion have ends bent in the positive direction of the x axis, and are connected to the second device via the ends.

4. The bus bar structure according to claim 1, wherein a one-turn loop is formed by a current path around the opening.

5. The bus bar structure according to claim 1, wherein the second device is arranged so as to be sandwiched in the direction of the y axis between the second connection portion and the fourth connection portion.

6. The bus bar structure according to claim 5, wherein a width in the direction of the z axis of the second connection portion and the fourth connection portion that are combined is greater than a width in the direction of the z axis of the second device arranged so as to be sandwiched between the second connection portion and the fourth connection portion.

7. The bus bar structure according to claim 1, wherein the first bent portion is formed to be shifted in the direction of the y axis relative to the first connection portion and the second connection portion, and the second bent portion is formed to be shifted toward a side opposite to the first bent portion in the direction of the y axis relative to the third connection portion and the fourth connection portion.

8. The bus bar structure according to claim 1, further comprising a bus bar fixing member formed in contact with the first connection portion, the second connection portion, the third connection portion, and the fourth connection portion and so as to surround the first bent portion and the second bent portion.

9. The bus bar structure according to claim 1, wherein the first connection portion and the second connection portion are not arranged on the same plane.

10. The bus bar structure according to claim 9, wherein a distance between the first connection portion and the third connection portion is greater than a distance between the second connection portion and the fourth connection portion.

11. The bus bar structure according to claim 1, wherein the first bus bar has a cutout surrounded by the first connection portion, the first bent portion, and the second connection portion, and the second bus bar has a cutout surrounded by the third connection portion, the second bent portion, and the fourth connection portion, and a size of the cutout of the first bus bar and a size of the cutout of the second bus bar are different from each other.

12. A power conversion device comprising the bus bar structure according to claim 5, wherein the second device arranged so as to be sandwiched between the second connection portion and the fourth connection portion is a power module.

13. The power conversion device according to claim 12, wherein a plurality of the power modules are connected while being stacked in the y-axis direction.

14. The power conversion device according to claim 12, wherein a snubber capacitor is connected between the first bus bar and the second bus bar near the power module.

* * * * *